(12) United States Patent
Lindsay et al.

(10) Patent No.: US 10,749,448 B2
(45) Date of Patent: Aug. 18, 2020

(54) ENGINEERED LOADING RESPONSE IN ELECTROACTIVE POLYMER DEVICES HAVING STRUCTURED NANOVOIDS

(71) Applicant: Facebook Technologies, LLC, Menlo Park, CA (US)

(72) Inventors: Jack Lindsay, Seattle, WA (US); Katherine Marie Smyth, Seattle, WA (US); Thomas John Farrell Wallin, Redmond, WA (US); Andrew John Ouderkirk, Redmond, WA (US); Tanya Malhotra, Redmond, WA (US); Austin Lane, Bellevue, WA (US); Christopher Yuan Ting Liao, Seattle, WA (US); Yigit Menguc, Kirkland, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 130 days.

(21) Appl. No.: 16/205,257

(22) Filed: Nov. 30, 2018

(65) Prior Publication Data

US 2020/0177103 A1 Jun. 4, 2020

(51) Int. Cl.
*H02N 1/00* (2006.01)
*G02B 3/14* (2006.01)
*G02B 27/01* (2006.01)

(52) U.S. Cl.
CPC ............ *H02N 1/006* (2013.01); *G02B 3/14* (2013.01); *G02B 27/0172* (2013.01); *G02B 2027/0178* (2013.01)

(58) Field of Classification Search
CPC ....... B29C 55/00; B29C 55/02; B29C 55/023; B32B 15/00; B32B 15/04; B32B 27/00; B32B 27/06; B32B 3/00; B32B 3/28
See application file for complete search history.

(56) References Cited

U.S. PATENT DOCUMENTS

| | | | | |
|---|---|---|---|---|
| 6,781,284 B1 * | 8/2004 | Pelrine | ..................... | F04B 35/00 310/330 |
| 6,969,395 B2 * | 11/2005 | Eskuri | ..................... | A61B 17/11 310/800 |
| 7,521,840 B2 * | 4/2009 | Heim | ................... | F04B 43/0054 310/330 |
| 7,595,580 B2 * | 9/2009 | Heim | ................... | G02B 13/009 310/324 |

(Continued)

OTHER PUBLICATIONS

Mullin et al., "Pattern Transformation Triggered by Deformation", Physical Review Letters, vol. 99, No. 8, 2007, 4 pages.

(Continued)

*Primary Examiner* — Tran N Nguyen
(74) *Attorney, Agent, or Firm* — FisherBroyles, LLP

(57) ABSTRACT

A device may include a primary electrode, a secondary electrode overlapping at least a portion of the primary electrode, and an electroactive polymer element disposed between and abutting the primary electrode and the secondary electrode. The electroactive polymer element may include a nanovoided polymer material whereby resistance to deformation of the electroactive polymer element is non-linear with respect to an amount of deformation of the electroactive polymer element. Various other devices, method, and systems are also disclosed.

20 Claims, 12 Drawing Sheets

(56) References Cited

U.S. PATENT DOCUMENTS

| | | | | |
|---|---|---|---|---|
| 7,956,520 | B2* | 6/2011 | Shankar | H01L 41/193 310/12.13 |
| 8,093,783 | B2* | 1/2012 | Rosenthal | F01L 9/04 310/328 |
| 8,222,799 | B2* | 7/2012 | Polyakov | H01L 41/0474 310/365 |
| 2018/0093456 | A1 | 4/2018 | Van Overmeere et al. | |

OTHER PUBLICATIONS

Babaee et al., "3D Soft Metamaterials with Negative Poisson's ratio", Advanced Materials, vol. 25, No. 36, 2013, 18 pages.

Bertoldi et al., "Novel negative Poisson's ratio behavior induced by an elastic instability", Advanced Materials, vol. 22, No. 3, 2010, pp. 1-11.

Overvelde et al., "Relating pore shape to the non-linear response of periodic elastomeric structures", Journal of the Mechanics and Physics of Solids, vol. 64, 2014, 16 pages.

Shen et al., "Simple cubic three-dimensional auxetic metamaterials", Physic. Status Solidi (B), vol. 251, No. 8, 2014, pp. 1515-1522.

Correa et al., "Negative Stiffness Honeycombs for Recoverable Shock Isolation", Rapid Prototyping Journal, vol. 21, No. 2, 2015, pp. 702-713.

Coulais et al., "Discontinuous Buckling of Wide Beams and Metabeams", Physical Review Letters, vol. 115, 2015, 7 pages.

Bickel et al., "Design and Fabrication of Materials with Desired Deformation Behavior", ACM Transactions on Graphics (TOG), vol. 29, No. 4, Jul. 2010, 10 pages.

Rosset et al., "Small, fast, and tough: Shrinking down integrated elastomer transducers", Applied Physics Reviews, vol. 3, No. 3, 2016, pp. 1-27.

Plante et al., "Large-scale failure modes of dielectric elastomer actuators", International Journal of Solids and Structures, vol. 43, 2006, pp. 7727-7751.

"Optotune DEAPs", Electroactive polymers, URL: https://www.optotune.com/technology/electroactive-polymers, 2019, 3 pages.

Product—Novasentis, "EMP Haptic Actuators for Sensory Innovation", URL: https://www.novasentis.com/product, 2019, 4 pages.

Rosset et al., "Mechanical characterization of a dielectric elastomer microactuator with ion-implanted electrodes", Sensor and Actuators A 144, 2008, 25 pages.

Gerratt et al., "Dielectric breakdown of PDMS thin films", Journal of Micromechanics and Microengineering, vol. 23, Apr. 26, 2013, 8 pages.

Hunt et al., "A self-healing dielectric elastomer actuator", Applied Physics Letters, vol. 104, 2014, 4 pages.

Skov et al., "Optimization Techniques for Improving the Performance of Silicone-Based Dielectric Elastomers", Advanced Engineering Materials, vol. 20, 2018, pp. 1-21.

Mazurek et al., "Glycerol as high-permittivity liquid tiller in dielectric silicone elastomers", Journal of Applied Polymer Science, vol. 133, No. 43, 2016, 28 pages.

Rao et al., "Synthesis of flexible silica aerogels using methyltrimethoxysilane (MTMS) precursor", Journal of Colloid and Interface Science, vol. 300, 2006, pp. 279-285.

Seo et al., "Reticulated Nanoporous Polymers by Controlled Polymerization-Induced Microphase Separation", Science, vol. 336, Jun. 15, 2012, 5 pages.

Jennings, S.G., "The mean free path in air", Journal of Aerosol Science, vol. 19, No. 2, 1988, pp. 1-2.

Gupta et al., "Nanoemulsions: formation, properties and applications", Soft Matter, 2016, 16 pages.

Helgeson et al., "Mesoporous organohydrogels from thermogelling photocrosslinkable nanoemulsions", Nature Materials, vol. 11, Apr. 2012, pp. 344-352.

Guha et al., "Creating nanoscale emulsions using condensation", Nature Communications, 8:1371, 2017, pp. 1-7.

Meier et al., "Microemulsion elastomers", Colloid Polymer Science, vol. 274, 1996, pp. 218-226.

Richter et al., "Design considerations of form birefringent microstructures", Applied Optics, vol. 34, No. 14, May 10, 1995, pp. 2421-2429.

Mahadik et al., "Elastic and Superhydrophobic Monolithic Methyltrimethyoxysilane-based Silica Aerogels by Two-step sol-gel process", Journal Microelectron, vol. 23, No. 1, 2016, pp. 35-39.

* cited by examiner

ENGINEERED LOADING RESPONSE IN ELECTROACTIVE POLYMER DEVICES HAVING STRUCTURED NANOVOIDS

BACKGROUND

Electroactive polymer (EAP) materials may change their shape under the influence of an electric field. EAP materials have been investigated for use in various technologies, including actuation, sensing and/or energy harvesting. Lightweight and conformable, electroactive polymers may be incorporated into wearable devices such as haptic devices and are attractive candidates for emerging technologies including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. VR/AR eyewear devices and headsets may also be used for purposes other than recreation. For example, governments may use such devices for military training, doctors may use such devices to simulate surgery, and engineers may use such devices as design visualization aids.

Traditionally, these and other applications that use electroactive polymers leverage the Poisson's ratio of the polymer material to generate a lateral expansion as a response to compression between conductive electrodes. Notwithstanding recent developments, it would be advantageous to provide electroactive polymer materials having improved deformational control, including materials exhibiting variable or even negative stiffness.

SUMMARY

As will be described in greater detail below, the instant disclosure relates to electroactive devices including a nanovoided polymer material. An example device may include a primary electrode, a secondary electrode overlapping at least a portion of the primary electrode, and an electroactive polymer element having a nanovoided polymer material disposed between and abutting the primary electrode and the secondary electrode. In some embodiments, incident to the incorporation of nanovoids into the electroactive polymer element, resistance to deformation of the electroactive polymer element may be non-linear with respect to an amount of deformation of the electroactive polymer element. In some embodiments, the electroactive polymer element may be configured to contract in a direction parallel to an electric field generated between the primary electrode and the secondary electrode, and also contract in at least one direction orthogonal to the electric field.

In example devices, nanovoids may occupy at least approximately 10% by volume of the nanovoided polymer material and may be distributed homogeneously or non-homogenously therein. For instance, the distribution of nanovoids within the electroactive polymer element may vary with thickness of the electroactive polymer element or the distribution may vary laterally, i.e., in one or more dimensions orthogonal to the thickness dimension. Disposed between the primary and secondary electrodes, the thickness of the electroactive polymer element may be 100 nanometers to 10 micrometers.

In some embodiments, the electroactive polymer element may have a strain energy greater than an electrostatic energy when an electric field of approximately 10% to approximately 90% of a dielectric strength of the electroactive polymer element is applied between the primary electrode and the secondary electrode. In some embodiments, a stress-strain curve of the electroactive polymer element may have a slope that increases with increasing strain. In some embodiments, a stress-strain curve of the electroactive polymer element may include a negative slope.

The electroactive polymer element may further include particles of a material such as barium titanate, where such particles have a high dielectric constant. Particles, such as high dielectric constant particles, may be disposed within the nanovoids or dispersed throughout the polymer matrix and may have an average diameter between approximately 10 nm and approximately 1000 nm.

According to some embodiments, an electroactive device may include a primary electrode, a secondary electrode overlapping at least a portion of the primary electrode, and an electroactive polymer element having a nanovoided polymer material disposed between and abutting the primary electrode and the secondary electrode. The electroactive polymer element may exhibit a negative effective Poisson's ratio along at least one dimension.

A corresponding method for forming an electroactive device may include forming a primary electrode, forming an electroactive polymer element comprising a nanovoided polymer material directly over the primary electrode, and forming a secondary electrode opposite the primary electrode and directly over the electroactive polymer element. The electroactive polymer element may exhibit at least one of a negative effective Poisson's ratio along at least one dimension, or non-linear resistance to deformation with respect to an amount of deformation of the electroactive polymer element. In at least one embodiment, the electroactive polymer element may exhibit a negative effective Poisson's ratio along each of a pair of mutually orthogonal dimensions.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate several exemplary embodiments and are a part of the specification. Together with the following description, these drawings demonstrate and explain various principles of the instant disclosure.

Figure 1:
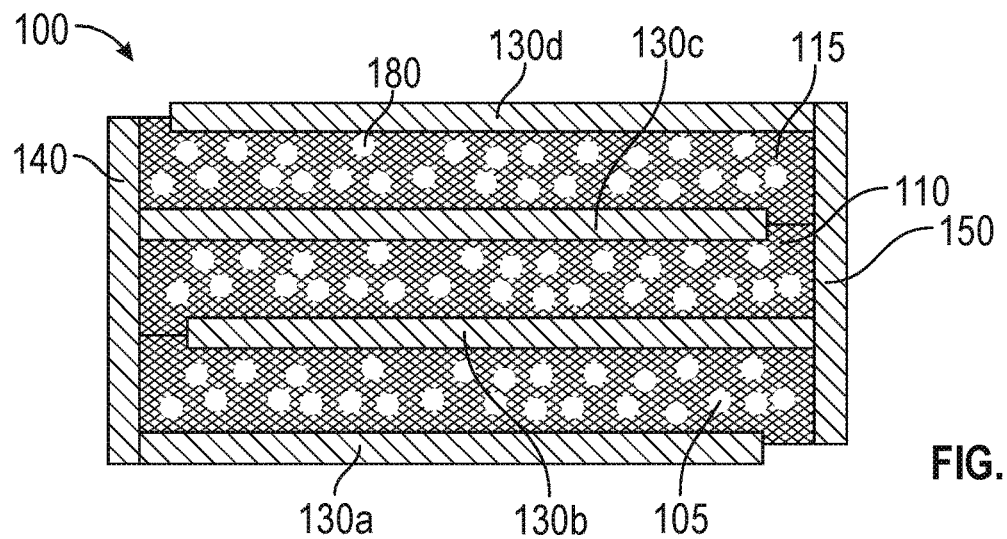
FIG. 1 shows a schematic diagram of an example electroactive device (e.g., an actuator, sensor, or an energy harvesting device) including an electroactive polymer element having randomly-distributed nanovoids in accordance with some embodiments of the disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

As will be explained in greater detail below, the present disclosure is generally directed to electroactive devices and more particularly to electroactive devices that have an electroactive polymer element that includes a nanovoided polymer material. The incorporation of nanovoids within the electroactive polymer element may affect the stress-strain behavior of the polymer material and can be used to engineer the deformation response of the device. In particular, the stress-strain response of example nanovoided polymers may exhibit a negative slope, i.e., negative stiffness, which may be related to a physical instability such as buckling. In certain embodiments, in response to compression, an electroactive polymer element including a nanovoided polymer material may exhibit lateral contraction rather than lateral expansion, which is characteristic of a negative effective Poisson's ratio.

In some embodiments, the lateral contraction may be approximately linearly proportional to the initial (i.e., unstressed) thickness of the electroactive polymer element with the constant of proportionality determined by materials properties of the nanovoided polymer material, including dielectric constant and elasticity. According to certain embodiments, bulk material properties such as dielectric strength and compressive stress-strain response can be controlled by altering the geometry of the nanovoids at the micro- and at the nano-scale.

According to various embodiments, electroactive devices may be used to actuate deformable optical elements in optical assemblies (e.g., lens systems). Such electroactive devices may convert electrical energy to mechanical energy (e.g., an actuator), but may also be configured to convert mechanical energy to electrical energy (e.g., an energy harvesting device). Examples of electroactive devices include, without limitation, actuators, sensors, microelectromechanical devices, and/or any other suitable devices.

In various embodiments, electroactive devices may include an electroactive polymer element including a nanovoided polymer material that is disposed between paired electrodes. The electrodes may allow the creation of the electric field that forces constriction of the electroactive polymer. Such electrodes may include relatively thin, electrically conductive layers or structures and may be of a non-compliant or compliant nature.

Any suitable materials may be utilized in the electrodes, including electrically conductive materials suitable for use in thin film electrodes, such as, for example, transparent conductive oxides, aluminum, silver, indium, gallium, zinc, carbon nanotubes, carbon black, and/or any other suitable materials formed by vacuum deposition, spray-coating, dip-coating and/or any other suitable technique either on a non-electroactive polymer layer or directly on the electroactive polymer surface itself. In some examples, an "electrode," as used herein, may refer to a conductive material, usually a thin film or a layer.

An electrode may be self-healing, such that when an area of an active layer (e.g., an electroactive polymer element) shorts out, the electrode may be able to isolate the damaged area. Suitable self-healing electrodes may include thin films of metals, such as, for example, aluminum.

In some embodiments, an electroactive device may include a stack of at least two electroactive polymer elements (e.g., elastomeric polymer elements) that are layered, with electrodes abutting opposing surfaces of each of the electroactive polymer elements. In some embodiments, the electroactive polymer elements may be driven by adjacent, opposing pairs of electrodes. As described below, electrodes may optionally be electrically connected to at least one adjacent common electrode extending along a lateral periphery of the stack via at least one contact layer.

As used herein, "electroactive polymers" may refer to polymers that exhibit a change in size or shape when stimulated by an electric field. In this regard, some electroactive polymers may have limited applications due to a low breakdown voltage of the polymers with respect to the operating voltage used by electroactive devices (e.g., actuators) that use the polymers. Accordingly, electroactive devices with reduced operating voltages and higher energy densities may be useful for many applications. Furthermore, many electroactive polymers, including bulk electroactive polymers, may exhibit only a lateral expansion in response to compression, which may also limit their applicability to particular device architectures. In contrast, the realization of a contraction in at least one lateral dimension in response to compression may be advantageous for certain applications.

In some examples, an electroactive polymer may include a deformable polymer that may be symmetric with regard to electrical charge (e.g., polydimethylsiloxane (PDMS) acrylates, etc.) or asymmetric (e.g., poled polyvinylidene fluoride (PVDF) or its co-polymers such as poly(vinylidene-fluoride-co-trifluoroethylene) (PVDF-TrFE)). Additional examples of polymer materials forming electroactive polymer materials may include, without limitation, styrenes, polyesters, polycarbonates, epoxies, halogenated polymers, such as PVDF, co-polymers of PVDF, such as PVDF-TrFE, silicone polymers, and/or any other suitable polymer materials. Such materials may have any suitable dielectric constant or relative permittivity, such as, for example, a dielectric constant ranging from approximately 1.2 to approximately 30.

In the presence of an electric field, an electroactive polymer may deform (e.g., compress, elongate, bend, etc.) according to the strength of that field. Generation of such a field may be accomplished, for example, by placing the electroactive polymer between two electrodes, each of which is at a different potential. As the potential difference (i.e., voltage difference) between the electrodes is increased or decreased (e.g., from zero potential) the amount of deformation may also increase, principally along electric field lines. This deformation may achieve saturation when a certain electric field strength has been reached. With no electric field, the electroactive polymer may be in its relaxed state undergoing no induced deformation, or stated equivalently, no induced strain, either internal or external.

The methods and systems shown and described herein may be used to form electroactive devices having a single layer or multiple layers of a nanovoided electroactive polymer (e.g., a few layers to tens, hundreds, or thousands of stacked layers). For example, an electroactive device may include a stack of from two electroactive polymer elements and corresponding electrodes to thousands of electroactive polymer elements (e.g., from 2 electroactive polymer elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive polymer elements, including ranges between any of the foregoing values). A large force or a large number of layers may be used to achieve a high displacement output, where the overall device displacement may be expressed as the sum of the displacement of each layer.

As noted, the electroactive devices (e.g., actuators) may include at least a first conductive material and a second conductive material (e.g., serving as electrodes). Further, a polymer material having nanovoids (e.g., a nanovoided polymer) may be disposed between the first and the second conductive materials.

In some embodiments, the nanovoided polymer material may include particles of a material with a high dielectric constant (e.g., barium titanate). The particles may have an average diameter of between approximately 10 and approximately 1000 nm (e.g., between approximately 10 and approximately 100 nm, between approximately 20 and approximately 100 nm, and the like). The particles of the high dielectric constant material may be dispersed throughout the nanovoided polymer material and/or incorporated into the voids of the nanovoided polymer material.

Methods of forming an electroactive device include forming electrodes and electroactive polymer materials sequentially (e.g., via vapor deposition, coating, printing, etc.) or simultaneously (e.g., via co-flowing, co-extrusion, slot die coating, etc.). Alternatively, the electroactive polymer materials may be deposited using initiated chemical vapor deposition (i-CVD), where, for example, suitable monomers of the desired polymers may be used to form the desired coating. In some embodiments, monomers, oligomers, pre-polymers, and/or polymers for forming the electroactive polymer may optionally be mixed with a solvent and the solvent may be removed from the electroactive polymer during and/or following curing to form nanovoids within the electroactive polymer. In certain embodiments, ordered arrays of nanovoids may be formed by self-assembly of block co-polymers or by using photolithographic processes.

Figure 4:
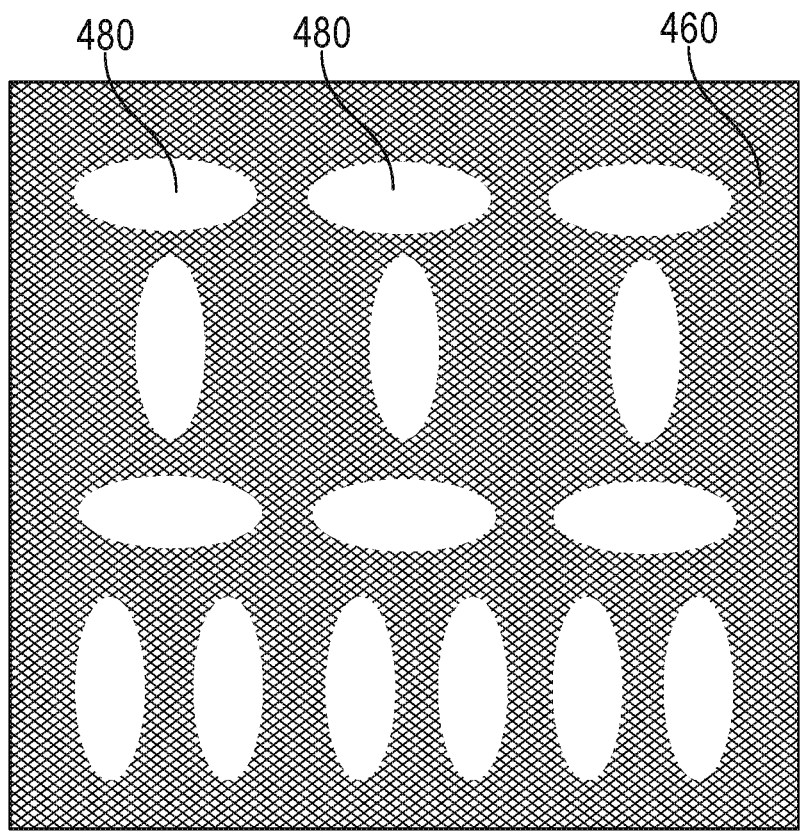
FIG. 4 shows a schematic diagram of an example network of mutually-isolated nanovoids according to some embodiments of the disclosure.
Figure 5:
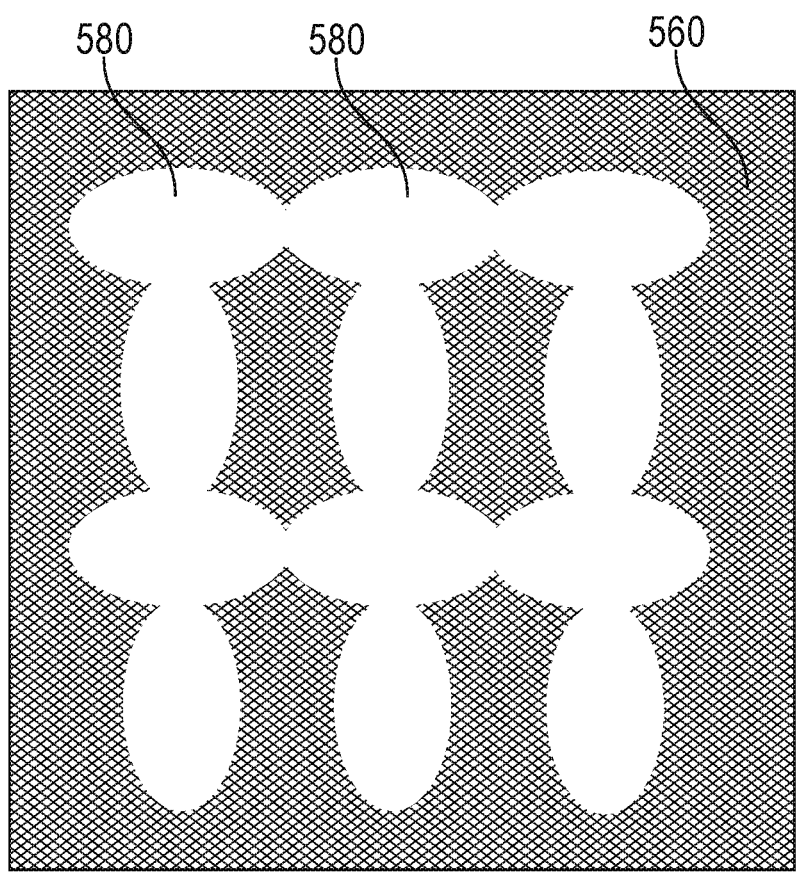
FIG. 5 shows a schematic diagram of an example network of interconnected nanovoids according to some embodiments of the disclosure.
Figure 5:
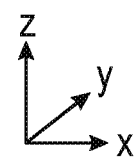
Figure 13:
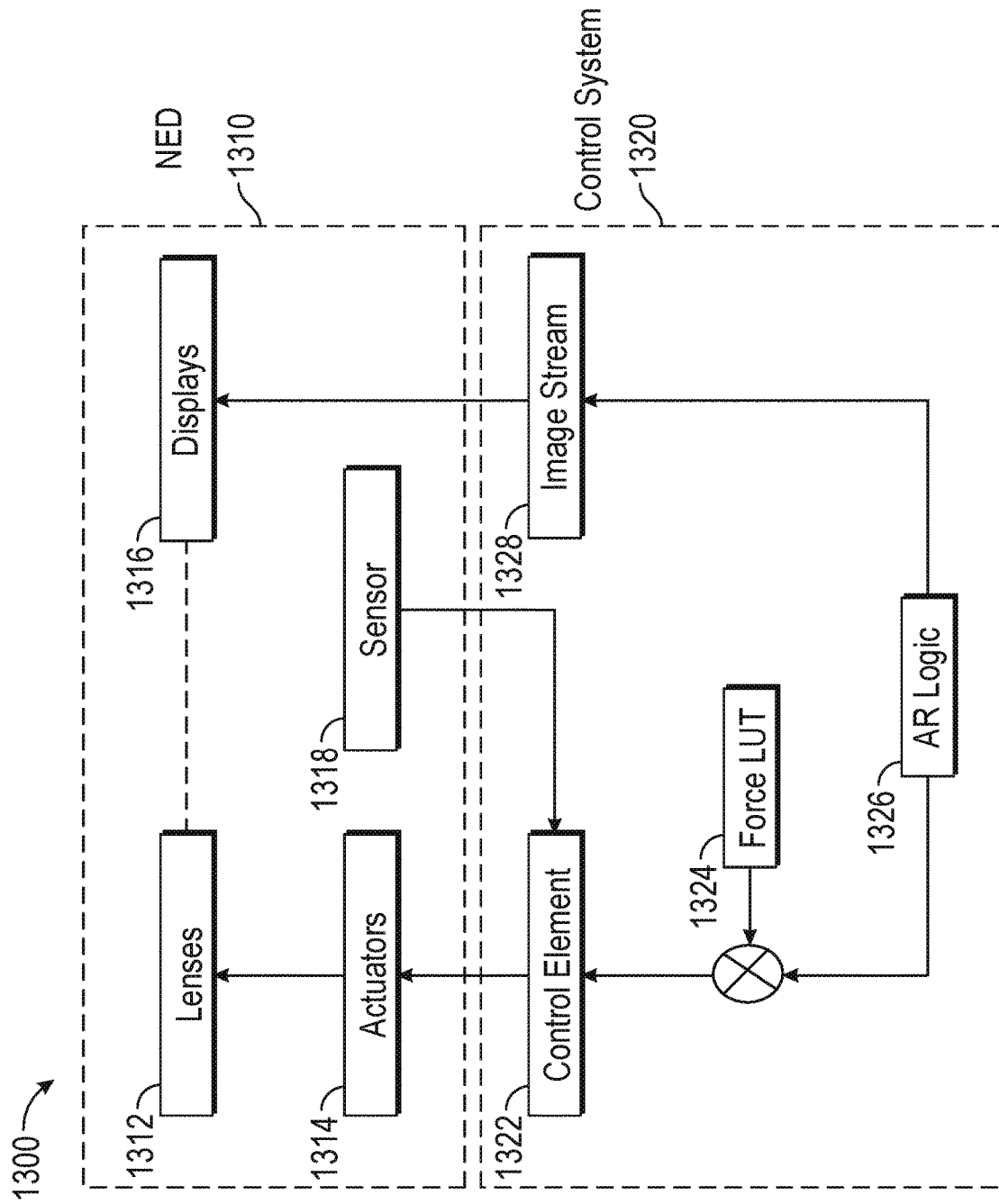
FIG. 13 shows a diagram of an example near-eye display system including a near-eye display and a control system, which may be communicatively coupled to each other, in accordance with some embodiments of the disclosure.
Figure 14:
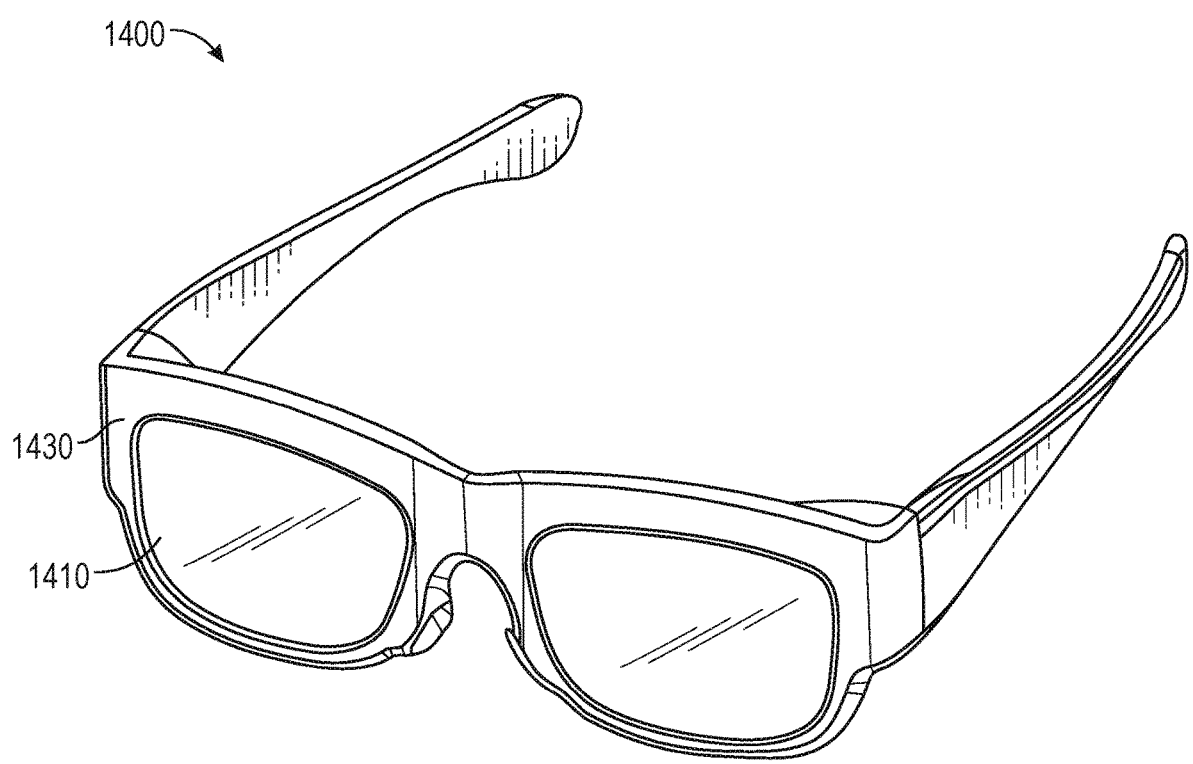
FIG. 14 shows a diagram of an example near-eye display having lenses including a lens assembly with multiple liquid lenses, in accordance with some embodiments of the disclosure.

The following will provide, with reference to FIGS. 1-15, detailed descriptions of systems, methods, and apparatuses for nanovoided materials, electroactive devices, and optical systems implementing electroactive devices (e.g., actuators) and the fabrication thereof. The discussion associated with FIGS. 1-3 includes a description of electroactive devices having an electroactive polymer element that includes a nanovoided polymer material in accordance with various embodiments. Example nanovoid geometries are discussed in connection with FIGS. 4 and 5. The discussion associated with FIGS. 6A-9 describes the deformation response of example electroactive polymer elements including a nanovoided polymer material. The discussion relating to the embodiments depicted in FIGS. 10A and 10B includes descriptions of example deformable element (e.g., liquid lens) designs and devices incorporating the electroactive devices. The discussion relating to the embodiments depicted in FIGS. 11 and 12 includes lens assembly devices including the nanovoid-containing electroactive devices. The discussion relating to the embodiment depicted in FIG. 13 shows a diagram for a near-eye display and control system, in accordance with example embodiments of the disclosure. The discussion relating to the embodiment depicted in FIG. 14 shows an example near-eye display having lenses that may be actuated with the disclosed electroactive devices. While many of the examples discussed herein may be directed to head-worn display systems, embodiments of the instant disclosure may be implemented in a variety of different types of devices and systems. Furthermore, detailed descriptions of methods for fabricating electroactive devices will be provided in connection with FIG. 15.

According to various embodiments, an electroactive device may include overlapping primary and second electrodes and an electroactive polymer element including a nanovoided polymer material disposed between and abutting the electrodes. The application of a voltage between the electrodes may induce a Maxwell stress that acts on the electroactive polymer element. The incorporation of nanoscale voids within the polymer material can alter the stress-strain behavior relative to bulk electroactive polymers, which can be used to define the manner by which an EAP responds to an applied voltage.

In some embodiments, resistance to deformation of the nanovoided electroactive polymer element may be non-linear with respect to an amount of deformation of the electroactive polymer element. In some embodiments, the nanovoided electroactive polymer element may exhibit a negative effective Poisson's ratio along at least one dimension such that compression in one dimension results in lateral contraction and/or buckling in one or more orthogonal dimensions.

Figure 2:
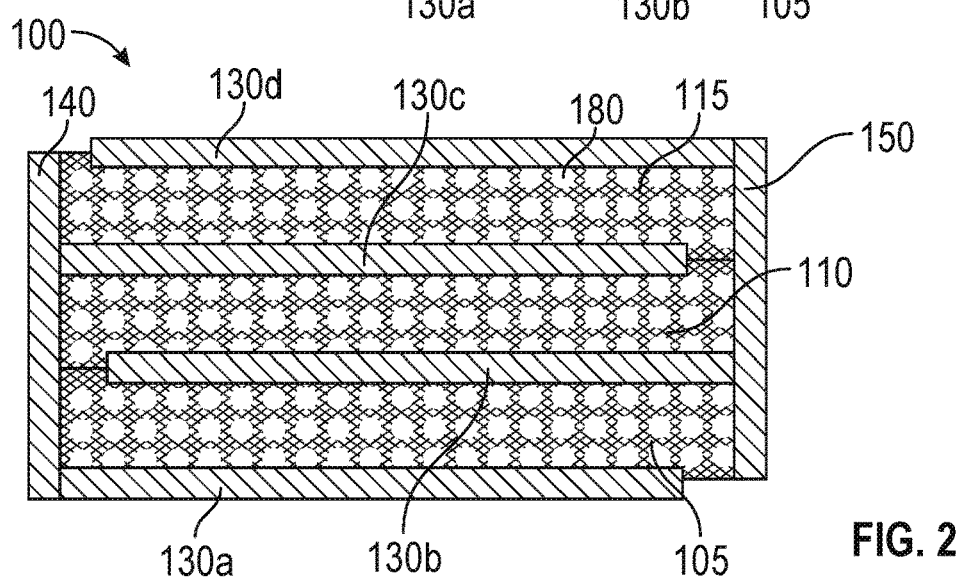
FIG. 2 shows a schematic diagram of an example electroactive device having an electroactive polymer element containing an ordered array of nanovoids in accordance with certain embodiments of the disclosure.
Figure 3:
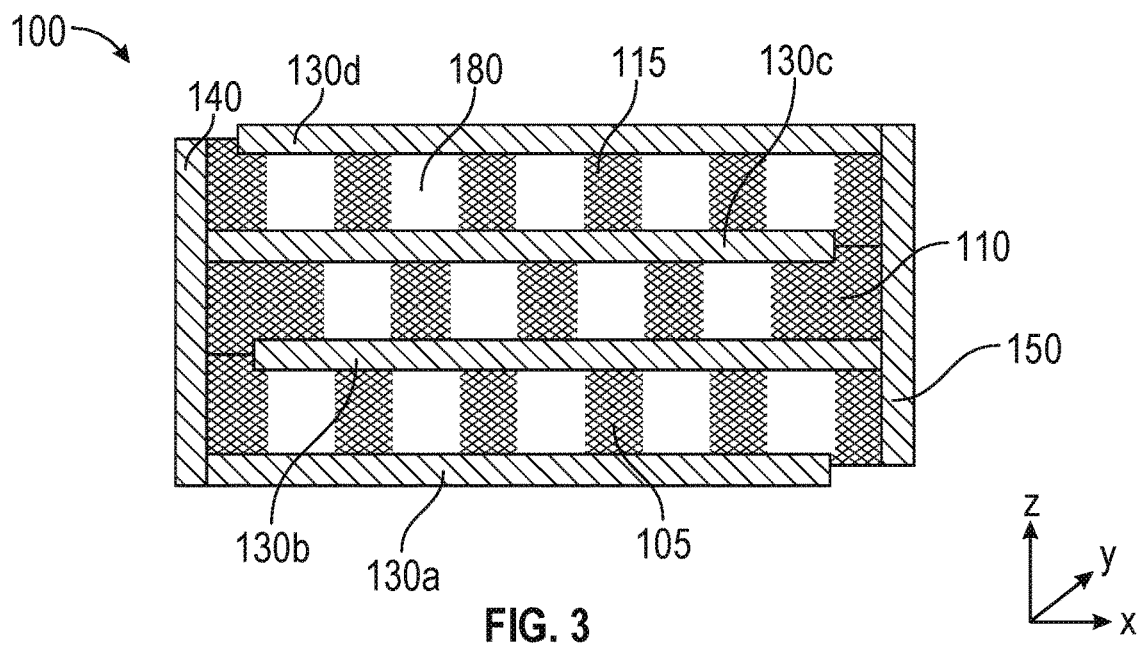
FIG. 3 shows a schematic diagram of an example electroactive device having an electroactive polymer element containing lithographically-defined nanovoids in accordance with certain embodiments of the disclosure.

As noted, electroactive devices may include actuators that include electroactive polymers. Nanovoids may be disposed throughout the polymer matrix. In some embodiments, the electroactive devices may include at least two polymer layers, with each layer being driven by a pair of electrodes. FIGS. 1-3 each show an example electroactive device (e.g., an actuator) 100 with a first electroactive polymer element (e.g., a first nanovoided elastomer material) 105, a second electroactive polymer element (e.g., a second nanovoided elastomer material) 110, a third electroactive polymer element (e.g., a third nanovoided elastomer material) 115, a primary electrode 130a, a secondary electrode 130b, a tertiary electrode 130c, and a quaternary electrode 130d. Illustrated are exemplary compressive EAP stack actuators with micro- and nano-scale modification through the incorporation of nanovoids 180 that are random (FIG. 1), ordered (FIG. 2), or lithographically patterned (FIG. 3).

In some embodiments, the primary electrode 130a and the tertiary electrode 130c may be connected to a primary common electrode 140, and the secondary electrode 130b and the quaternary electrode 130d may be connected to a secondary common electrode 150 that is electrically isolated from the primary common electrode 140.

In some embodiments, the electrodes 130a, 130b, 130c, 130d may be spaced away from one other and at least partially overlap in a horizontal direction. In some embodiments, the secondary electrode 130b may overlap (i.e., overlap in a horizontal direction) at least a portion of the primary electrode 130a, the tertiary electrode 130c may overlap at least a portion of the secondary electrode 130b, and the quaternary electrode 130d may overlap at least a portion of the tertiary electrode 130c.

The first electroactive polymer element 105 may include a first elastomer material disposed between and abutting the primary electrode 130a and the secondary electrode 130b. The second electroactive polymer element 110 may include a second elastomer material disposed between and abutting the secondary electrode 130b and the tertiary electrode 130c. The third electroactive polymer element 115 may include a third elastomer material disposed between and abutting the tertiary electrode 130c and the quaternary electrode 130d. In some embodiments, the primary common electrode 140 may be electrically coupled (e.g., electrically contacted at an interface having a low contact resistance) to the primary electrode 130a and the tertiary electrode 130c. The secondary common electrode 150 may be electrically coupled to the secondary electrode 130b and the quaternary electrode 130d.

In some embodiments, an electroactive device 100 may include additional layers that are not shown in FIGS. 1-3. For example, an additional electroactive polymer element (not shown) may be disposed on a side of the quaternary electrode 130d opposite the third electroactive polymer element 115. The additional electroactive polymer element may overlie the first electroactive polymer element 105, the second electroactive polymer element 110, and the third electroactive polymer element 115.

Furthermore, an additional electrode (not shown) may be disposed abutting a surface of the additional electroactive polymer element that faces away from the third electroactive polymer element 115. In some embodiments, the electroactive device 100 may include more (e.g., two, three, or more) such additional electroactive polymer elements and corresponding electrodes. For example, an electroactive device may include a stack of from two electroactive polymer elements and corresponding electrodes to thousands of electroactive polymer elements (e.g., from 2 electroactive polymer elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, greater than approximately 2000 electroactive polymer elements, including ranges between any of the foregoing values).

In some embodiments, as used herein, an "elastomer material" may refer to a polymer with viscoelasticity (i.e., both viscosity and elasticity) and relatively weak intermolecular forces, and generally low elastic modulus (a measure of the stiffness of a solid material) and high failure strain compared with other materials. In some embodiments, the electroactive polymer elements (e.g., the first electroactive polymer element 105, the second electroactive polymer element 110, and the third electroactive polymer element 115) may include an elastomer material that has an effective Poisson's ratio of less than approximately 0.35, and may include an auxetic material that has a negative Poisson's ratio. For instance, the elastomer material may have an effective Poisson's ratio of less than approximately 0.35 (e.g., 0.35, 0.3, 0.25, 0.2, 0.15, 0.1, 0.05, −0.05, −0.1, −0.15, −0.2, −0.25, −0.3, −0.35, or less, including ranges between any of the foregoing values).

In at least one example, the elastomer material may have an effective density that is less than approximately 90% (e.g., less than approximately 80%, less than approximately 70%, less than approximately 60%, less than approximately 50%, less than approximately 40%) of the elastomer when densified (e.g., when the elastomer is compressed, for example, by electrodes to make the elastomer more dense). In some examples, the term "effective density," as used herein, may refer to a parameter that may be obtained using a test method where a uniformly thick layer of the elastomer may be placed between two flat and rigid circular plates. In some embodiments, the diameter of the elastomer material being compressed may be at least 100 times the thickness the elastomer material. The diameter of the elastomer material may be measured, then the plates may be pressed together to exert a pressure of at least approximately $1 \times 10^6$ Pa on the elastomer, and the diameter of the elastomer is remeasured. The effective density may be determined from the following expression: $D_{ratio} = D_{uncompressed}/D_{compressed}$, where $D_{ratio}$ may represent the effective density ratio, $D_{uncompressed}$ may represent the density of the uncompressed polymer, and $D_{compressed}$ may represent the density of the uncompressed polymer.

In some examples, the electroactive polymer elements (e.g., the first electroactive polymer element 105, the second electroactive polymer element 110 and the third electroactive polymer element 115) may be voided and/or nanovoided (i.e., having a plurality of voids and/or nano-sized voids in the material composing the electroactive polymer element). In some embodiments, the nanovoids may occupy at least approximately 10% of the volume of the electroactive polymer elements (e.g., approximately 10% by volume, approximately 20% by volume, approximately 30% by volume, approximately 40% by volume, approximately 50% by volume, approximately 60% by volume, approximately 70% by volume, approximately 80% by volume, approximately 90% by volume, including ranges between any of the foregoing values).

The voids and/or nanovoids may be either closed- or open-celled, or a combination thereof. For open-celled voids, the void size may be the minimum average diameter of the cell. In some embodiments, the polymer layer may include a thermoset material and/or any other suitable material having an elastic modulus of less than approximately 10 GPa (e.g., approximately 0.5 GPa, approximately 1 GPa, approximately 2 GPa, approximately 3 GPa, approximately 4 GPa, approximately 5 GPa, approximately 6 GPa, approximately 7 GPa, approximately 8 GPa, or approximately 9 GPa, including ranges between any of the foregoing values).

An effective modulus ($Y_{\it{eff}}$) for a nanovoided polymer material where the modulus of the material within the voids (e.g., air) is much less than the modulus of the polymer matrix ($Y_{void} \ll Y_{dielectric}$) can be expressed as $Y_{\it{eff}} = Y_{dielectric}(1 - \varnothing_{void})$, where $\varnothing_{void}$ is the volume fraction of voids.

According to some embodiments, nanovoids may be distributed homogeneously or non-homogeneously throughout the nanovoided polymer material. By way of example, the void size and/or the void size distribution may vary spatially within the nanovoided polymer material, i.e., laterally and/or with respect to the thickness of the nanovoided polymer material. Adjusting the void fraction of the EAP can tune its compressive stress-strain characteristics.

The voids and/or nanovoids may be any suitable size and, in some embodiments, the voids 180 may approach the scale of the thickness of the polymer layer in the undeformed state. For example, the voids may be between approximately 10 nm to about equal to the gap between respective pairs of electrodes as shown schematically in FIG. 3. In some embodiments, the voids 180 may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, or approximately 1000 nm, including ranges between any of the foregoing values).

According to some embodiments, the voids may be substantially spherical, although the void shape is not particularly limited. For instance, in addition to, or in lieu of spherical voids, the nanovoided polymer material may include voids that are oblate, prolate, lenticular, ovoid, etc., and may be characterized by a convex and/or a concave cross-sectional shape. Furthermore, the voids may be mutually-isolated or interconnected. By way of example, a nanovoided polymer material 460 including a network of mutually-isolated oval voids 480 is shown schematically in FIG. 4, while a nanovoided polymer material 560 including a network of interconnected oval voids 580 is shown schematically in FIG. 5. In the embodiment illustrated in FIG. 4, the distribution of nanovoids 480 may vary with the thickness of the nanovoided polymer material 460 (i.e., in the z-direction).

Returning to FIGS. 1-3, in certain embodiments, the first electroactive polymer element 105 may be deformable from an initial state to a deformed state when a first voltage is applied between the primary electrode 130*a* and the secondary electrode 130*b*. Moreover, the second electroactive polymer element 110 may be deformable, in conjunction with deformation of the first electroactive polymer element 105, from an initial state to a deformed state when a second voltage is applied between the secondary electrode 130*b* and the tertiary electrode 130*c*, and the third electroactive polymer element 115 may be deformable, in conjunction with deformation of the first and second electroactive polymer elements 105, 110, from an initial state to a deformed state when a third voltage is applied between the tertiary electrode 130*c* and the quaternary electrode 130*d*. The first, second, and third voltages may be equal or unequal.

In some embodiments, applying the voltage to the electrodes (e.g., the primary electrode 130*a*, the secondary electrode 130*b*, the tertiary electrode 130*c* and/or the quaternary electrode 130*d*) may create at least approximately 10% strain (e.g., an amount of deformation in the direction of the applied force resulting from the applied voltage divided by the initial dimension of the material) in the electroactive polymer element(s) in at least one direction (e.g., an x, y, or z direction with respect to a defined coordinate system).

In some embodiments, the application of a voltage to one or more of the electroactive polymer elements may change the internal pressure of gasses within the nanovoided regions thereof. For example, gasses may diffuse either into or out of the electroactive polymer element during dimensional changes associated with its deformation. Such changes in the electroactive polymer elements can affect, for example, the hysteresis of an electroactive device (e.g., electroactive device 100) incorporating the electroactive polymer during dimensional changes, and also may result in drift when the electroactive polymer element's dimensions are rapidly changed.

Accordingly, in an embodiment, the nanovoids may be filled with a gas to suppress electrical breakdown of the electroactive polymer element (for example, during deformation). The gas may include air, nitrogen, oxygen, argon, sulfur hexafluoride and/or any suitable gas. In another aspect, the electroactive device (e.g., an actuator) 100 may have a sealing layer (not shown) applied to the edges of the electroactive device 100, and/or to one or more of the electrodes, or a combination thereof. Suitable sealing layers may include thin film layers of an inorganic material, such as silica, applied with any suitable method, including, for example, atomic layer deposition (ALD), physical vapor deposition (PVD), chemical vapor deposition (CVD), or the like. The thin film layers may also be made from one or more dyads of a polymer layer and an inorganic layer. In an embodiment, the sealing layer may also include a barrier material, such as polychlorotrifluoroethylene (PCTFE) and/or other polymer, applied by solvent and/or with initiated-CVD.

In some embodiments, each of the electroactive polymer elements 105, 110, 115 may independently have a maximum thickness in an undeformed state and a compressed thickness in the deformed state. By way of example, the first elastomer material may have a density, when the first electroactive polymer element 105 is in the undeformed state, that is approximately 90% or less of a density of the first elastomer material when the first electroactive polymer element 105 is in the deformed state. The second elastomer material may have a density, when the second electroactive polymer element 110 is in the undeformed state, that is approximately 90% or less of a density of the second elastomer material when the second electroactive polymer element 110 is in the deformed state. The third elastomer material may have a density, when the third electroactive polymer element 115 is in the undeformed state, that is approximately 90% or less of a density of the third elastomer material when the third electroactive polymer element 115 is in the deformed state.

In some embodiments, the first elastomer material may exhibit a compressive strain of at least approximately 10% when a voltage is applied between the primary electrode 130a and the secondary electrode 130b, the second elastomer material may exhibit a compressive strain of at least approximately 10% when a voltage is applied between the secondary electrode 130b and the tertiary electrode 130c, and the third elastomer material may exhibit a compressive strain of at least approximately 10% when a voltage is applied between the tertiary electrode 130c and the quaternary electrode 130d.

In some embodiments, one or more of the electroactive polymer elements 105, 110, 115 may include particles of a material having a high dielectric constant, the particles having an average diameter between approximately 10 nm and approximately 1000 nm. In some embodiments, the material having the high dielectric constant may include barium titanate ($BaTiO_3$), which is a member of the perovskite family and which may also include other titanates. The material having the high dielectric constant may be disposed within the voids 180 and/or throughout the matrix of the nanovoided polymer material.

$BaTiO_3$ is a ferroelectric material with a relatively high polarization and dielectric constant (e.g., a value of between approximately 500 and approximately 7000), and may be used in various electroactive devices described herein. Besides large polarizability and permittivity, large strains may also be achievable with $BaTiO_3$. Pure $BaTiO_3$ is an insulator whereas upon doping it may transform into a semiconductor in conjunction with the polymer material. In some embodiments, the particles of the materials having high dielectric constant may be included in the polymer to modify a mechanical (e.g., a Poisson's ratio) or electrical property (resistance, capacitance, etc.) of the first electroactive polymer element 105, the second electroactive polymer element 110, or the third electroactive polymer element 115. Additionally or alternatively, any other suitable component may be added to the electroactive polymer material.

In some embodiments, the first electroactive polymer element 105, the second electroactive polymer element 110, the third electroactive polymer element 115 and/or the at least one additional electroactive polymer element (not shown) may have a thickness of approximately 10 nm to approximately 10 μm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 μm, approximately 2 μm, approximately 3 μm, approximately 4 μm, approximately 5 μm, approximately 6 μm, approximately 7 μm, approximately 8 μm, approximately 9 μm, or approximately 10 μm, including ranges between any of the foregoing values), with an example thickness of approximately 200 nm to approximately 500 nm.

In some embodiments, the electroactive polymer elements 105, 110, 115 may include a first elastomer material, a second elastomer material, and a third elastomer material, respectively, each having an effective Poisson's ratio of approximately 0.35 or less. In some embodiments, the first electroactive polymer element 105, the second electroactive element 110 and/or the third electroactive polymer element 115 may include particles of a material to assist the formation or to support the voided regions, or both. Suitable particles include a silicate, such as silica, including structures resulting from silica gels, fumed silica, a titanate, such as barium titanate, a metal oxide, such as titanium dioxide, composites thereof, and the like. The particles may have an average diameter between approximately 10 nm and approximately 1000 nm, and the particles may form branched or networked particles with average dimensions of between approximately 100 and approximately 10,000 nm.

In some embodiments, the common electrodes (e.g., the primary common electrode 140 and the secondary common electrode 150) may be structured in a number of different ways than shown in FIGS. 1-3. For example, the common electrodes may form a sloped shape, or may be a more complex shape (e.g., patterned or freeform). In some embodiments, the common electrodes may be shaped to allow compression and expansion of the electroactive device 100 during operation.

In some embodiments, the electrodes (e.g., the primary electrode 130a, the secondary electrode 130b, the tertiary electrode 130c, the quaternary electrode 130d, the primary common electrode 140, and the secondary common electrode 150) may include metals such as aluminum, gold, silver, tin, copper, indium, gallium, zinc, and the like. Other conductive materials may be used, including carbon nanotubes, graphene, transparent conductive oxides (TCOs, e.g., indium tin oxide (ITO), zinc oxide (ZnO), etc.), and the like.

In some configurations, the electrodes may be configured to stretch elastically. In such embodiments, the electrodes may include TCOs, graphene, carbon nanotubes, and the like. In other embodiments, for example, embodiments where electroactive devices have electroactive polymer elements including nanovoided electroactive polymer materials, relatively rigid electrodes (e.g. electrodes including a metal such as aluminum) may be used.

In some embodiments, the electrodes (e.g., the primary electrode 130a, the secondary electrode 130b, the tertiary electrode 130c, the quaternary electrode 130d, the primary common electrode 140, and the secondary common electrode 150) may have a thickness of approximately 1 nm to approximately 1000 nm, with an example thickness of approximately 10 nm to approximately 50 nm. Some of the electrodes (e.g., the primary electrode 130a, the secondary electrode 130b, the tertiary electrode 130c, the quaternary electrode 130d, or the at least one additional electrode, not shown) may be designed to allow healing of electrical breakdown (e.g., the electric breakdown of elastomeric polymer materials) of the first electroactive polymer element 105, the second electroactive polymer element 110, the third electroactive polymer element 115 and/or the at least one additional electroactive polymer element (not shown). In some embodiments, a thickness of an electrode (e.g., the primary electrode 130a, the secondary electrode 130b, the tertiary electrode 130c, the quaternary electrode 130d, or the at least one additional electrode, not shown) that includes a self-healing electrode (e.g., an aluminum electrode) may be approximately 20 nm.

In some embodiments, the electrodes (e.g., the primary electrode 130a, the secondary electrode 130b, the tertiary electrode 130c, the quaternary electrode 130d, the primary common electrode 140, and the secondary common electrode 150) may be fabricated using any suitable process. For example, the electrodes may be fabricated using physical vapor deposition (PVD), chemical vapor deposition (CVD), evaporation, spray-coating, spin-coating, atomic layer deposition (ALD), and the like. In another aspect, the electrodes may be manufactured using a thermal evaporator, a sputtering system, a spray coater, a spin-coater, an ALD unit, or using printing or stamping and the like.

Figures 6A, 6B:
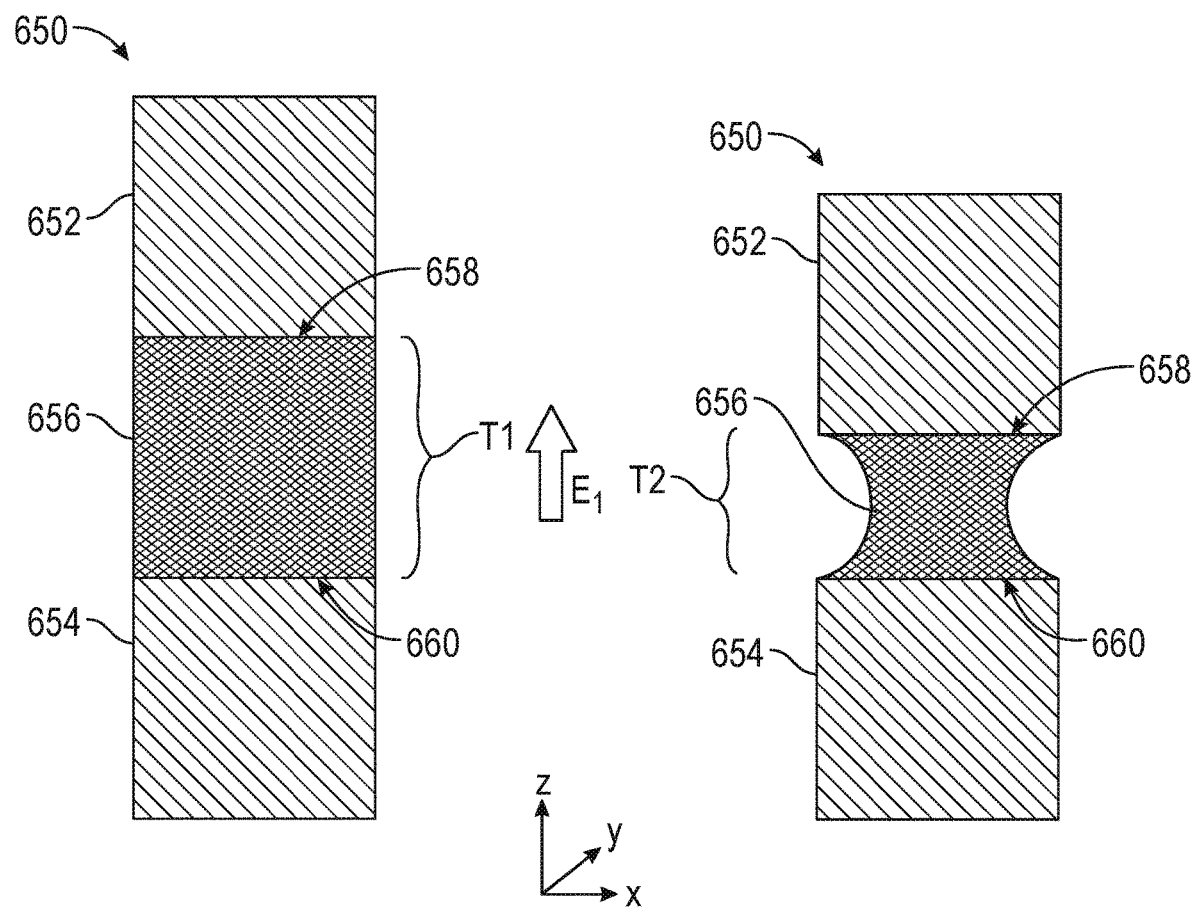
FIG. 6A shows a diagram of another example nanovoided electroactive device in accordance with some embodiments of the disclosure.
FIG. 6B shows a diagram of the example nanovoided electroactive device of FIG. 6A in a compressed state in accordance with some embodiments of the disclosure.

According to some embodiments, and referring to FIGS. 6A and 6B, an electroactive device 650 may include a pair of electrodes including a primary electrode 652 and a secondary electrode 654. These paired electrodes may be spaced with an electroactive polymer element 656 formed of a nanovoided polymer positioned therebetween such that primary electrode 652 abuts a first surface 658 of nanovoided electroactive polymer element 656 and secondary electrode 654 abuts a second surface 660 of nanovoided electroactive polymer element 656 opposite the first surface 658. Electroactive polymer element 656 have any suitable dimensions, including any suitable thickness and/or width, without limitation.

In some embodiments, electroactive polymer element 656 may be deformable from an undeformed state, as illustrated in FIG. 6A, or a partially deformed state to a more fully deformed state, as illustrated in FIG. 6B, when a voltage difference is applied between primary electrode 652 and secondary electrode 654. In some embodiments, the deformed state of electroactive polymer element 656 may be a compressed state in which electroactive polymer element 656 has a decreased thickness $T_2$ in the z-direction, as shown in FIG. 6B. Thickness, as used herein, may refer to the extent of at least a portion of an electroactive polymer element parallel to an E-field generated between paired electrodes abutting the electroactive polymer element. In some embodiments, the initial state of electroactive polymer element 656 may be a state that is not influenced by an E-field or one already influenced by an E-field generated between primary electrode 652 and secondary electrode 654, and the E-field may be increased to amplify the E-field-induced deformations.

An exemplary direction $E_1$ of the lines of the electric field between primary electrode 652 and secondary electrode 654 is represented in FIGS. 6A and 6B. According to some embodiments, an amount of deformation of electroactive polymer element 656 in the deformed state, as shown in FIGS. 6A and 6B, may correspond to the strength of the E-field or, equivalently, an amount of voltage applied between primary electrode 652 and secondary electrode 654. In at least one example, when electroactive polymer element 656 is in a compressed state, electroactive polymer element 656 may contract laterally (i.e., in the x-direction shown in FIG. 6B) such that electroactive polymer element 656 has a decreased width in the x-direction. In some embodiments, in addition to, or in lieu of, a contraction in the x-direction, the electroactive polymer element 656 may contract laterally in the y-direction (not shown).

Electroactive polymer element 656 may have a maximum thickness (e.g., thickness $T_1$ shown in FIG. 6A) in an undeformed or relaxed state and a minimum thickness (e.g., thickness $T_2$ shown in FIG. 6B) in a deformed state (e.g., a maximally deformed state) when a voltage difference of at least a certain value is applied between primary electrode 652 and secondary electrode 654. In some embodiments the maximum thickness of electroactive polymer element 656 may be from approximately 10 nm to approximately 10 μm. Additionally, or alternatively, a width of electroactive polymer element 656 in the undeformed state may be from approximately 100 nm to approximately 100 μm (e.g., approximately 100 nm, approximately 500 nm, approximately 1 μm, approximately 10 μm, approximately 20 μm, approximately 30 μm, approximately 40 μm, approximately 50 μm, approximately 60 μm, approximately 70 μm, approximately 80 μm, approximately 90 μm, or approximately 100 μm, including ranges between any of the foregoing values). Width, as used herein, may refer to the extent of at least a portion of an electroactive polymer element in a dimension transverse to that of the expected electric field.

Figure 7:
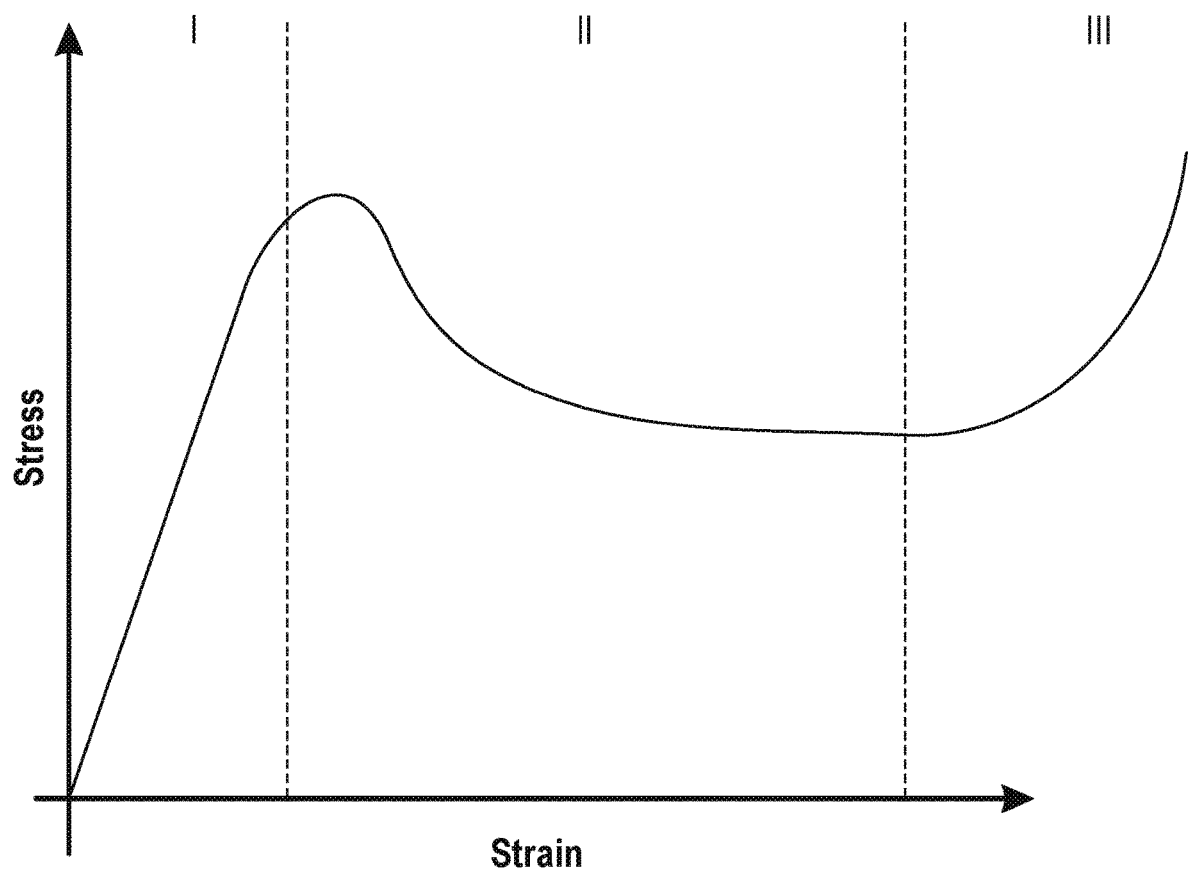
FIG. 7 shows a diagram of an example plot of stress versus strain for nanovoided polymer materials in accordance with one or more embodiments of the disclosure.

Non-linear resistance to deformation of an example nanovoided polymer material is illustrated in FIG. 7, which shows a qualitative plot of stress versus strain where the stress response may be considered over three regions (I-III). Within region I, stress increases monotonically with strain evidencing a linear elastic behavior and a local stress maximum, e.g., with increasing voltage. The elastic modulus of the nanovoided polymer material may be derived from the slope of the stress-strain curve in the elastic deformation region (region I). According to certain embodiments, the nanovoided polymer material may include a thermoset polymer and has an elastic modulus of less than approximately 10 GPa (e.g., less than approximately 0.5, 1, 2, 5 or 10 GPa) including ranges between any of the foregoing values.

Within region II, the stress plateaus and decreases with increasing strain (i.e., the compressive stress-strain curve exhibits a negative slope) which may be attributable to buckling of the nanovoided polymer material and an attendant negative stiffness. Referring to region III, the slope of the stress-strain curve is again positive, which is associated with collapse of the nanovoids and compaction of the nanovoided polymer material. With reference again to FIG. 6B, buckling and void collapse may be accompanied by a lateral contraction of the polymer material in one or more transverse directions, i.e., contraction in the x-direction and/or contraction in the y-direction. According to some embodiments, such a non-linear resistance to deformation may enable simplified control of an electrostatic device, as a single voltage may be used to generate a range of stiffening behavior. Compressive pre-loading of a bending mode or diaphragm EAP actuator can induce buckling behavior under stress induced via an applied voltage.

Figure 8A:
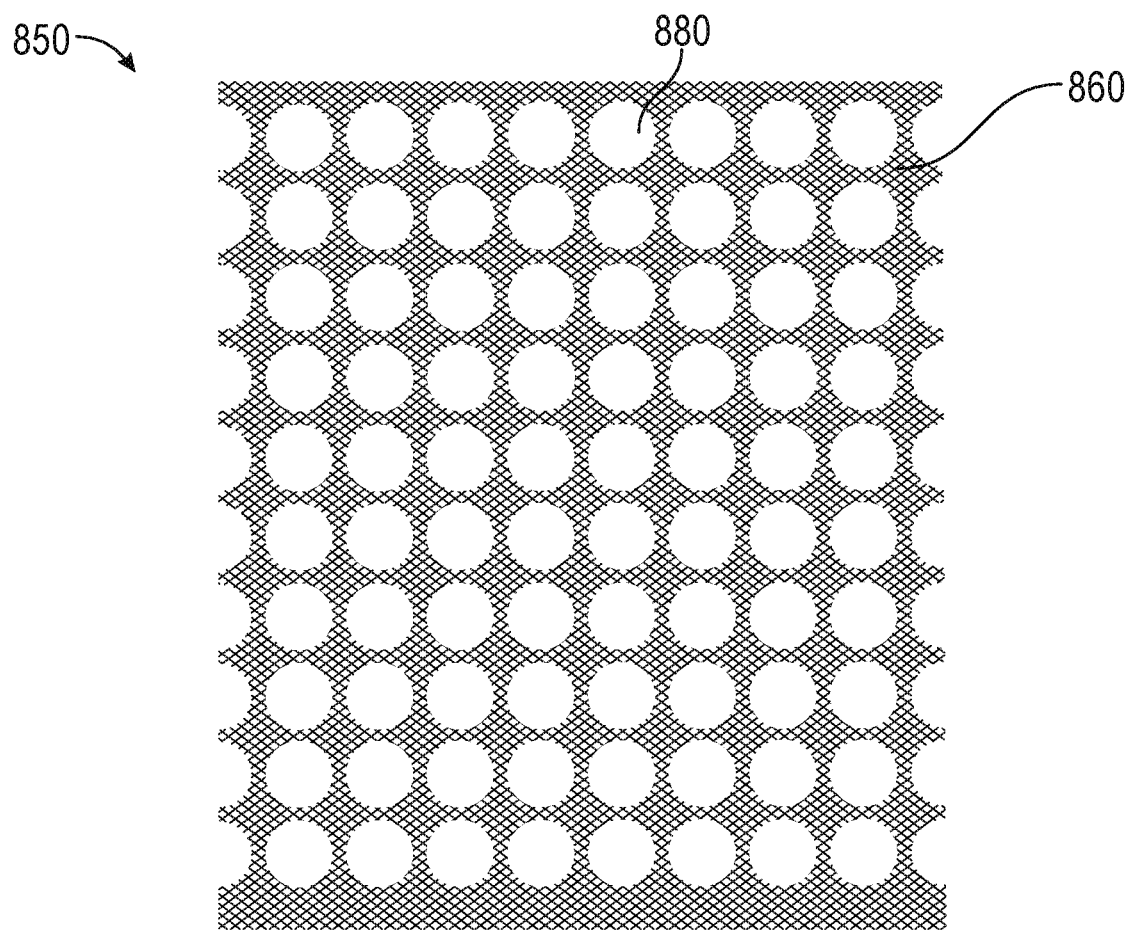
FIG. 8A shows a schematic cross-sectional diagram of an example electroactive polymer element including a nanovoided polymer material.
Figure 8B:
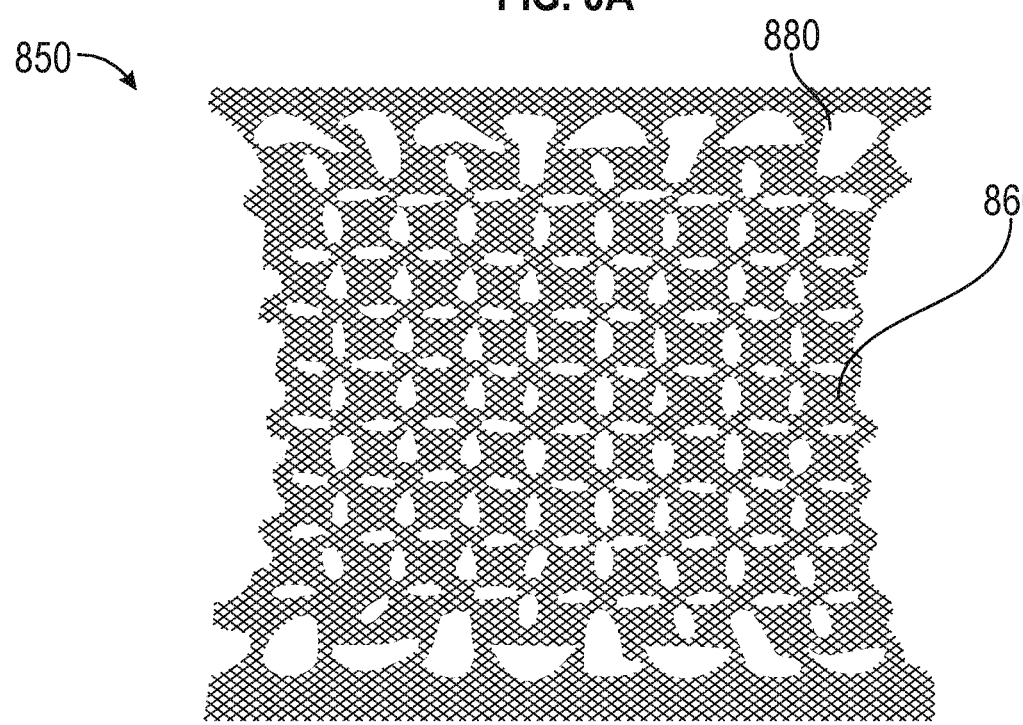
FIG. 8B shows a schematic diagram of the example electroactive polymer element of FIG. 8A exhibiting a negative effective Poisson's ratio in a lateral dimension in response to the application of a compressive stress in accordance with some embodiments of the disclosure.

Buckling deformation of an example electroactive polymer element is shown schematically in FIGS. 8A and 8B. A representation of an un-stressed electroactive polymer element 850 including a homogeneous polymer material 860 having a regular array of nanovoids 880 is shown in FIG. 8A. Following the application of a compressive stress, i.e., in the z-direction, the nanovoids 880 collapse and the electroactive polymer element 850 buckles and exhibits an attendant lateral contraction, i.e., in the x-direction, as shown in FIG. 8B.

The incorporation of nanovoids into the nanovoided polymer material is not restricted to changing the properties of the entirety of the electroactive polymer element. Nanovoids may be used selectively throughout the nanovoided polymer material to induce different behavior locally within the electroactive polymer element, e.g., such that different portions of the electroactive polymer element respond differently to the same voltage.

Figure 9:
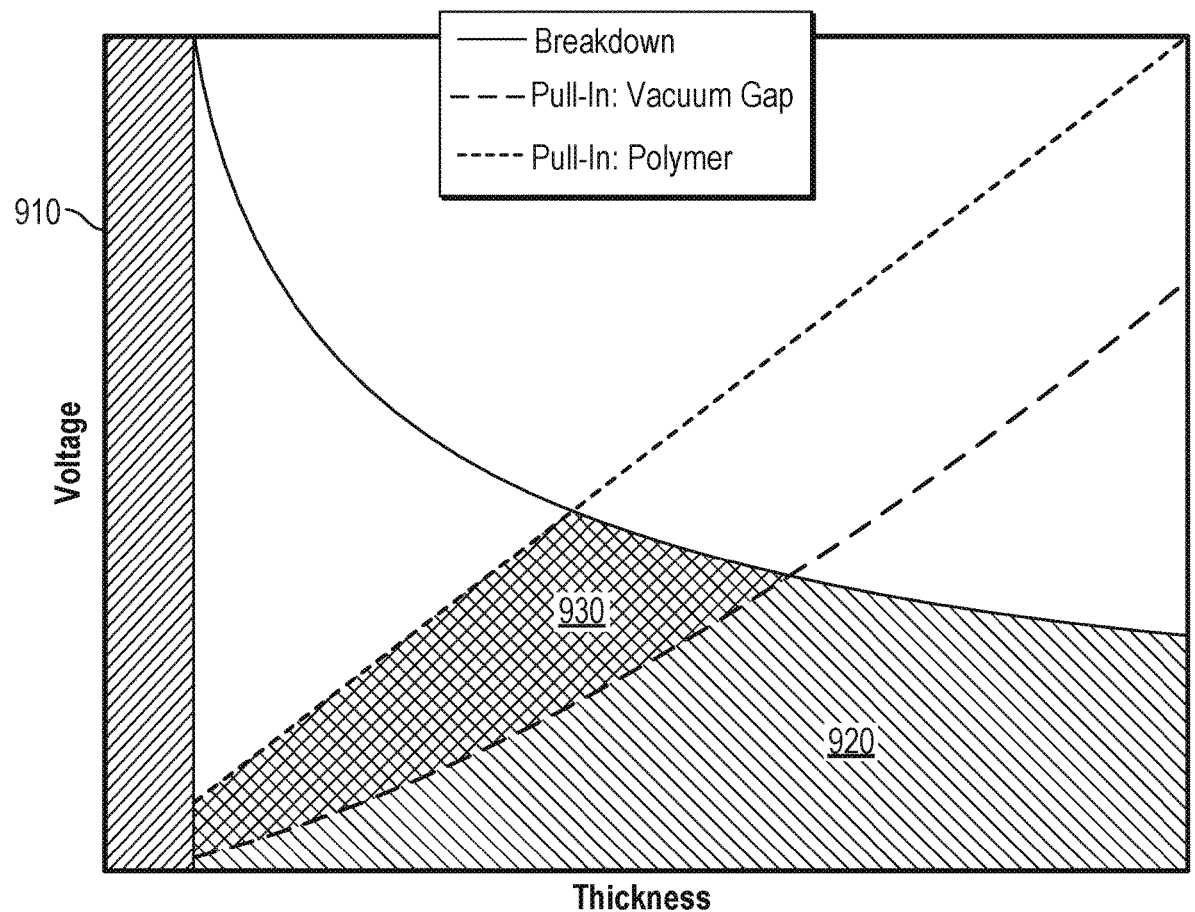
FIG. 9 shows a diagram of a plot comparing the pull-in voltage of a conventional electrostatic actuator having a vacuum gap and that of an electroactive polymer to the empirical dielectric breakdown voltage of a polydimethylsiloxane (PDMS) thin film.

FIG. 9 theoretically compares the pull-in voltage (or the voltage at maximum electrostatic energy before instability and collapse) of a standard electrostatic actuator including a vacuum gap and that of an EAP to an empirically-determined dielectric breakdown voltage for PDMS films. Region 910 highlights thicknesses below 100 nanometer to 1 micrometer, where the dielectric breakdown can be difficult to predict. Region 920 shows the operating regime for a standard electroactive device with a vacuum gap and combined regions 920 and 930 represent the wider operating regime achievable for a nanovoided electroactive polymer.

Figure 10A:
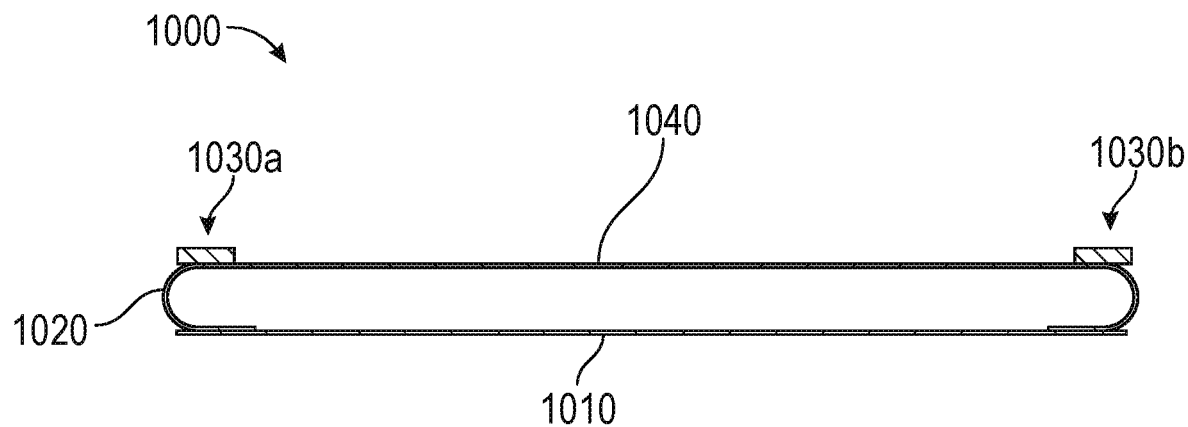
FIG. 10A shows a cross-sectional view of an example deformable element and a lens assembly that may include electroactive devices, in accordance with some embodiments of the disclosure.

FIG. 10A shows a diagram of a cross-sectional view of an example deformable element and a lens assembly that may include one or more electroactive devices, in accordance with example embodiments of the disclosure. As shown in FIG. 10A, adjustable lens 1000 may be an adjustable lens with a structural support element 1010 (e.g., a rigid backplane) and a deformable optical element 1040, with a seal 1020 formed between the structural support element 1010 and the deformable optical element 1040.

In various embodiments, the adjustable lens may include any suitable type of lens with adjustable optical properties (e.g., adjustable optical power/focal length, correcting for wavefront distortion and/or aberrations, etc.). In some examples, as will be explained in greater detail below, an adjustable lens may include a liquid lens. For example, adjustable lens 1000 may be filled with an optical medium that is at least partially encapsulated by a deformable optical element (i.e., between structural support element 1010 and deformable optical element 1040). For example, lens 1000 may be filled with a liquid or a semi-solid material (e.g., a gel, a semi-solid polymer, etc.). In general, lens 1000 may contain a substantially transparent material that deforms and/or flows under pressure.

Structural support element 1010 and deformable optical element 1040 may be composed of any suitable materials. In some examples, structural support element 1010 may include a rigid material. For example, structural support element 1010 may be composed of a rigid, substantially transparent polymer. Deformable optical element 1040 may include a substantially transparent and elastic material. For example, deformable optical element 1040 may be composed of a natural or synthetic elastomer that returns to a resting state when a deforming force is removed. As will be explained in greater detail below, in some examples deformable optical element 1040 may be deformed using an electroactive device generating a directly-driven force to produce a desired optical power or other optical property for lens 1000.

Although the lens 1000 is unactuated in FIG. 10A, forces may be applied by electroactive device(s) to lens 1000 to actuate the lens 1000 (as will be described in connection with FIG. 10B). Further, such forces may be uniform around a perimeter of lens 1000 or may be variable around the perimeter of lens 1000. For example, a vector (not shown) corresponding to a force applied by mechanical action of a first electroactive device (e.g., a first actuator) 1030a may be the same as a vector corresponding to a force applied by mechanical action of a second electroactive device (e.g., a second actuator) 1030b. Alternatively, a vector corresponding to a force applied by mechanical action of a first electroactive device 1030a may be different from a vector corresponding to a force applied by mechanical action of a second electroactive device 1030b.

Figure 10B:
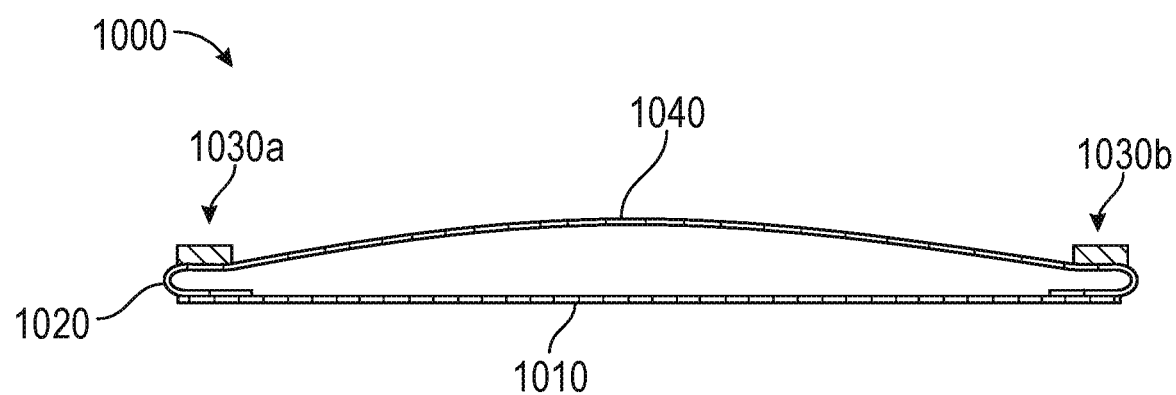
FIG. 10B shows another cross-sectional view of the deformable element and a lens assembly of FIG. 10A in an actuated state, in accordance with some embodiments of the disclosure.

FIG. 10B shows a diagram of a cross-sectional view of the example deformable element and a lens assembly of FIG. 10A in an actuated state, in accordance with example embodiments of the disclosure. In particular, FIG. 10B depicts adjustable lens 1000 being actuated by receiving force applied by mechanical action of two different electroactive devices. In this example, a first electroactive device (e.g., a first actuator) 1030a may apply a pushing force (not shown) having a vector of a first magnitude and first direction to a first area on the perimeter of lens 1000. A second electroactive device (e.g., a second actuator) 1030b may apply a pushing force (not shown) having vector of a second magnitude and second direction to a second area on the perimeter of lens 1000 to achieve a desired optical power or other optical property for the lens 1000. Those skilled in the art will understand that other embodiments may use various combinations of compression and distension, with various numbers of actuators applying varying forces to various locations on a deformable optical element to achieve desired optical properties for the lens.

The forces applied by the electroactive device in FIG. 10A to actuate the lens 1000, as well as any other suitable forces, may be applied by any suitable type electroactive device, such as that shown and described in connection with FIGS. 1-3 of the disclosure. In another aspect, at least one of the electroactive devices (e.g., one of the electroactive devices 1030a and 1030b) may include a direct-drive actuator. As used in some embodiments, the term "direct-drive actuator" may refer to any actuator used in a direct-drive system or configuration (e.g., any configuration that does not involve an intermediate, off-axis device to transmit power). In contrast, indirect-drive systems may have at least one drive-train component (e.g., a belt, a chain, a ball-screw mechanism, a gear, etc.) that is not connected along the same axis of movement as the actuator. Examples of direct-drive actuators may include, without limitation, electrically driven actuators, electroactive benders, voice coil actuators, shape memory alloys, hydraulic pumps, etc.

As noted, in various embodiments, a direct-drive actuator may include a bender. In some examples, the term "bender," as used herein, may refer, without limitation, to an electrically-driven actuator based on a plate or beam design that converts in-plane contraction, via an applied electric field, into out-of-plane displacement. A bender or bending actuator may include an all-electroactive or composite material stack operated in a bimorph, unimorph, or multilayered monolith configuration. In some embodiments, the term "unimorph bender," as used herein, may refer, without limitation, to a beam or plate having an electroactive layer and an inactive layer, in which displacement results from contraction or expansion of the electroactive layer. In some embodiments, the term "bimorph bender," as used herein, may refer, without limitation, to a beam or plate having two electroactive layers, in which displacement results from expansion or contraction of one layer with alternate contraction or expansion of the second layer.

In some embodiments, the term "multilayer bender," as used herein, may refer, without limitation, to a multilayer stack of electroactive, electrode, and insulation layers integrated with alternating contracting and expanding electroactive layers into a monolithic bender. The piezoelectric layers in multilayer piezoelectric benders may enable high electric fields (and therefore high force and displacement) to occur at low voltages. Multilayer benders may include multiple thin piezoceramic layers, which may require lower voltages to achieve similar internal stress to bimorph and unimorph designs. Charge and voltage control in open or closed loops may also be implemented in multilayer benders, with some adjustment. In some examples, a control system for a multilayer bender may not require a high voltage power supply.

According to some embodiments, an actuator may be a frame-contoured ring bender and/or may include stacked or overlapping benders. Furthermore, actuator volume may be constrained to an edge region outside an optical aperture, which may include a perimeter volume of a lens, an optical element, an optical sub-assembly, etc. As noted, electroactive device(s) such as an actuator (or a set of actuators) may provide equal or varied force and displacement at discrete points or along a spatially-defined distribution at the perimeter of a lens.

The electroactive device including direct-drive benders disclosed herein may include an electroactive polymer element that is disposed between two electrodes. In such examples, methods of forming an electroactive device may involve forming electrodes and an electroactive polymer simultaneously (e.g., via co-flowing, slot die coating, etc.).

Figure 11:
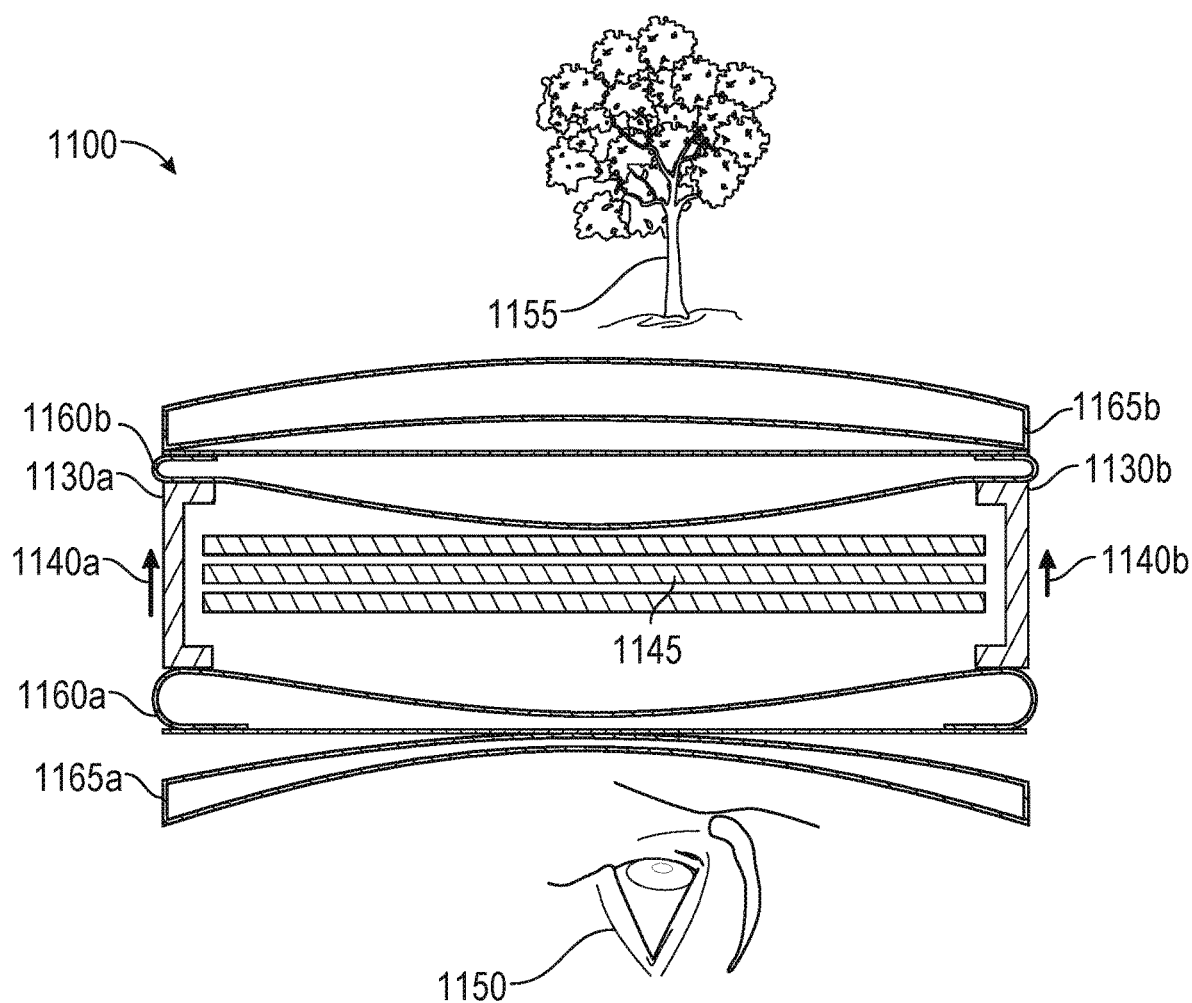
FIG. 11 shows a cross-sectional view of an example lens assembly device with multiple deformable elements (e.g., multiple liquid lenses) that may include electroactive devices, in accordance with some embodiments of the disclosure.

FIG. 11 shows a diagram of an example cross-sectional view of a lens assembly device with multiple deformable elements (e.g., multiple liquid lenses) including electroactive devices, in accordance with example embodiments of the disclosure. In particular, FIG. 11 shows a side view of a lens-display assembly 1100. As shown in FIG. 11, lens-display assembly 1100 may include an adjustable-focus lens 1160(a) and an adjustable-focus lens 1160(b). In addition, lens-display assembly 1100 may include a carriage 1130(a) and a carriage 1130(b), each of which connect adjustable-focus lens 1160(a) to adjustable-focus lens 1160(b) (e.g., via respective electroactive devices).

Because carriages 1130(a) and 1130(b) are connected to electroactive devices (e.g., direct-drive actuators) coupled to both adjustable-focus lens 1160(a) and adjustable-focus lens 1160(b), when carriage 1130(a) and/or 1130(b) moves, carriage 1130(a) and/or 1130(b) may apply forces to adjustable-focus lens 1160(a) and adjustable focus lens 1160(b) simultaneously, thereby deforming and modifying the optical power of adjustable-focus lenses 1160(a) and 1160(b).

In addition, in some examples, lens-display assembly 1100 may include a display 1145 situated between adjustable-focus lenses 1160(a) and 1160(b). For example, display 1145 may include an augmented-reality display that is substantially translucent (except for, e.g., virtual objects displayed by display 1145), allowing a user's eye 1150 to see beyond display 1145 to real-world objects such as a tree 1155 illustrated in FIG. 11.

In some embodiments, carriages 1130(a) and 1130(b) may each apply equal pressure to adjustable-focus lens 1160(a) and adjustable focus lens 1160(b) (e.g., pressure sufficient to maintain tension within the respective membranes of adjustable-focus lenses 1160(a) and 1160(b) but not to deform adjustable-focus lenses 1160(a) and 1160(b)). Accordingly, adjustable-focus lenses 1160(a) and 1160(b) may be flat and exhibit no substantial optical power. Thus, the apparent accommodation distance of a virtual object displayed by display 1145 may be the actual distance of display 1145 from the user's eye 1150. Likewise, lens-display assembly 1100 may not significantly change the appearance of tree 1155 to the user's eye 1150.

In some examples, one or more of the carriages described herein may be rigid. Additionally or alternatively, one or more of the carriages described herein may have a degree of elasticity in one or more directions. In some examples, the length of the carriages may be fixed. In some examples, the length of the carriages may be adjustable. For example, the length of a carriage may be manually adjustable by using, e.g., a set screw or an adjustable threaded shaft. Additionally or alternatively, the length of the carriage may be dynamically adjustable through the use of, e.g., a piezoelectric stack.

FIG. 11 depicts lens-display assembly 1100 in an adjusted state. As shown in FIG. 11, carriages 1130(a) and 1130(b) may be actuated by one or more actuators (e.g., electroactive devices as described herein) to move away from the user's eye 1150 and adjustable-focus lens 1160(a), and toward adjustable-focus lens 1160(b). In the process, forces 1140(a) and 1140(b) applied by carriages 1130(a) and 1130(b), respectively, may shape adjustable-focus lens 1160(a) into a plano-concave lens, and shape adjustable-focus lens 1160(b) into a plano-convex lens. Adjustable-focus lens 1160(a) may thereby cause an image displayed by display 1145 to appear closer to eye 1150. At the same time, adjustable-focus lens 1160(b) may compensate for the optical power created by adjustable-focus lens 1160(a) so that the appearance of tree 1155 is not significantly affected by the change to adjustable-focus lens 1160(a).

As should be appreciated, in some examples intermediate positions of carriages 1130(a) and 1130(b) may result in intermediate changes to the apparent accommodation distance of images displayed by display 1145, allowing for a continuous range of possible apparent accommodation distances for virtual objects while maintaining the fidelity of the appearance of real-world objects.

In some embodiments, additional optical elements such as lens 1165a and lens 1165b may be included to provide additional optical power. In some embodiments, the lenses 1165a and 1165b may include prescription lenses that may be used to treat refractive errors of the eye, which may include, for example, myopia, hypermetropia, astigmatism, and presbyopia, and the like. In other embodiments, the prescription lenses may be customized to correct for a given user's refractive errors, which may include various components, such as a sphere component to address myopia and/or presbyopia, a cylinder component to address astigmatism, and a prism component to address strabismus and other binocular vision disorders.

Figure 12:
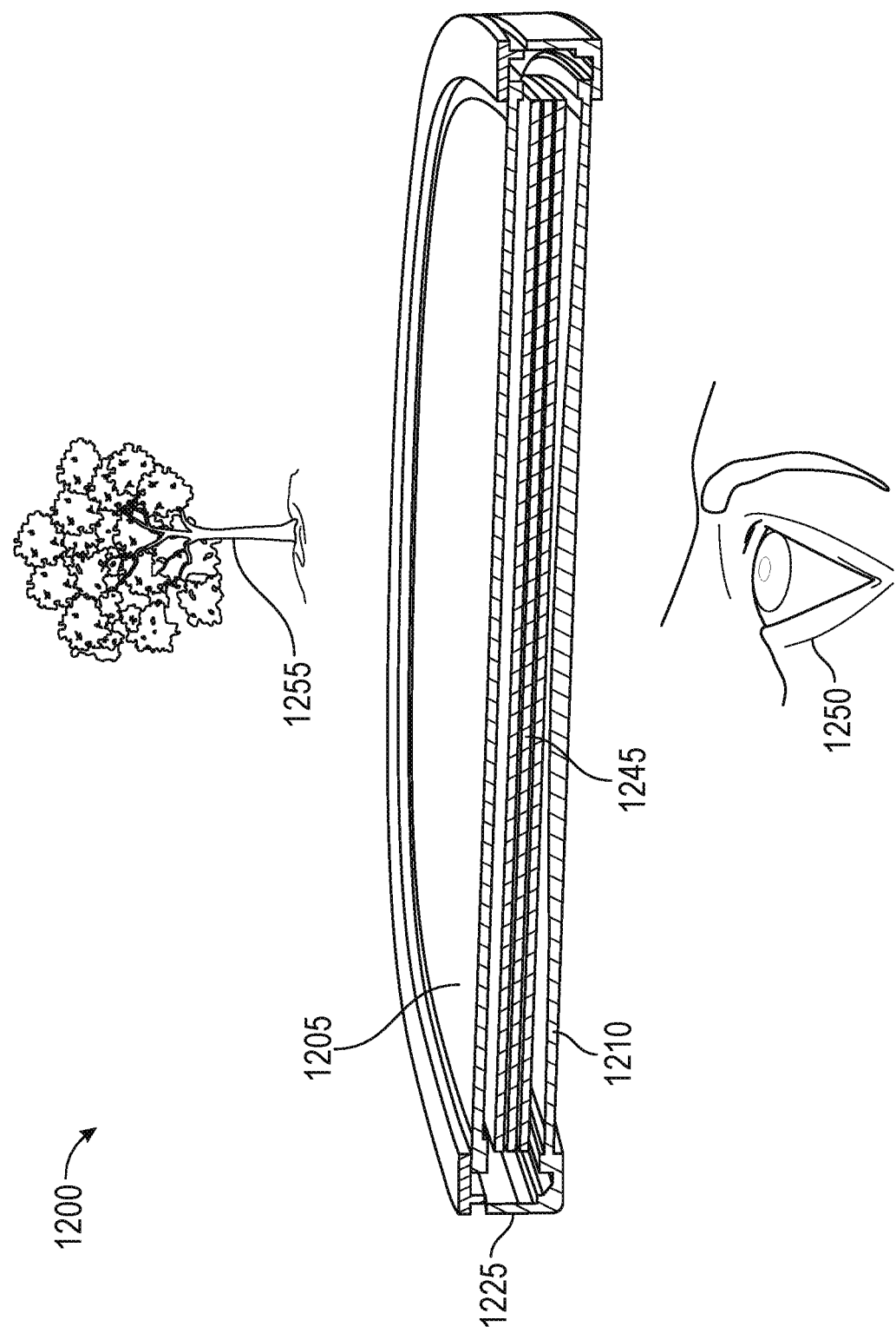
FIG. 12 shows another cross-sectional view of an example lens assembly device having multiple deformable elements and which may include electroactive devices, in accordance with some embodiments of the disclosure.

FIG. 12 illustrates a cross-section of a lens-display assembly 1200, in accordance with at least one embodiment. As shown in FIG. 12, lens-display assembly 1200 may include an adjustable lens 1205, an adjustable lens 1210, a display 1245 positioned between adjustable lenses 1205 and 1210, and a lens assembly housing 1225. In some examples, the volume between lens assembly housing 1225 and display 1245 may provide space for electroactive devices (e.g., direct drive actuators) as described herein. According to some examples, the combination of adjustable lenses 1205 and 1210 may modify the apparent accommodation distance of images created by display 1245 without changing the appearance of distant real-world objects (e.g., tree 1255) as perceived by a user's eye 1250.

As shown in FIG. 13, a near-eye display system 1300 may include a near-eye display (NED) 1310 and a control system 1320, which may be communicatively coupled to each other. The near-eye display 1310 may include lenses 1312, electroactive devices (e.g., actuators) 1314, displays 1316, and a sensor 1318. Control system 1320 may include a control element 1322, a force lookup table (LUT) 1324, and augmented reality (AR) logic 1326.

Augmented reality logic 1326 may determine what virtual objects are to be displayed and real-world positions onto which the virtual objects are to be projected. Accordingly, augmented reality logic 1326 may generate an image stream 1328 that is displayed by displays 1316 in such a way that alignment of right- and left-side images displayed in displays 1316 results in ocular vergence toward a desired real-world position.

Control element 1322 may use the same positioning information determined by augmented reality logic 1326, in combination with force lookup table 1324, to determine an amount of force to be applied by electroactive devices 1314 (e.g., actuators), as described herein, to lenses 1312. Electroactive devices 1314 may, responsive to control element 1322, apply appropriate forces to lenses 1312 to adjust the apparent accommodation distance of virtual images displayed in displays 1316 to match the apparent vergence distance of the virtual images, thereby reducing or eliminating vergence-accommodation conflict. Control element 1322 may be in communication with sensor 1318, which may measure a state of the adjustable lens. Based on data received from sensor 1318, the control element 1322 may adjust electroactive devices 1314 (e.g., as a closed-loop control system).

In some examples, display system 1300 may display multiple virtual objects at once and may determine which virtual object a user is viewing (or is likely to be viewing) to identify a virtual object for which to correct the apparent accommodation distance. For example, the system may include an eye tracking system (not shown) that provides information to control element 1322 to enable control element 1322 to select the position of the relevant virtual object.

Additionally or alternatively, augmented reality logic 1326 may provide information about which virtual object is the most important and/or most likely to draw the attention of the user (e.g., based on spatial or temporal proximity, movement, and/or a semantic importance metric attached to the virtual object). In some examples, the augmented reality logic 1326 may identify multiple potentially important virtual objects and select an apparent accommodation distance that approximates the virtual distance of a group of the potentially important virtual objects.

Control system 1320 may represent any suitable hardware, software, or combination thereof for managing adjustments to adjustable lenses 1312. In some examples, control system 1320 may represent a system on a chip (SOC). As such, one or more portions of control system 1320 may include one or more hardware modules. Additionally or alternatively, one or more portions of control system 1320 may include one or more software modules that perform one or more of the tasks described herein when stored in the memory of a computing device and executed by a hardware processor of the computing device.

Control system 1320 may generally represent any suitable system for providing display data, augmented reality data, and/or augmented reality logic for a head-mounted display. In some examples, control system 1320 may include a graphics processing unit (GPU) and/or any other type of hardware accelerator designed to optimize graphics processing.

Control system 1320 may be implemented in various types of systems, such as the augmented reality glasses 1400 illustrated in FIG. 14. As shown, glasses 1400 may include adjustable-focus lenses 1410 coupled to a frame 1430 (e.g., at an eyewire, not shown). In some embodiments, control system 1320 of FIG. 13 may be integrated into frame 1430. Alternatively, all or a portion of control system 1320 may be in a system remote from glasses 1400 and configured to control electroactive devices (e.g., actuators) in glasses 1400 via wired or wireless communication.

In an embodiment, each of lenses 1410 may include, for example, an optical fluid encapsulated by an elastomeric membrane and an optically clear and rigid back substrate. Actuation along the perimeter of lenses 1410 (e.g., using one or more electroactive devices as further shown and described in connection with FIGS. 1-3) may change the curvature (and thus the optical power) of the lenses, with positive and negative shapes determined by the direction of the applied force. In an embodiment, a membrane surface may be non-planar (e.g., concave or convex) at rest (e.g., at zero electrical power). In one example, a membrane surface may be non-planar when a substrate is curved.

Electroactive devices (e.g., actuators) mounted in frame 1430 (e.g., in an eyewire) may deform each lens, with high optical quality achieved through tailored displacement and deflection, and via perimeter mounting for an asymmetric clear aperture including, for example, an RGB (red-green-blue) waveguide.

As noted, control system 1320 of FIG. 13 may trigger electroactive devices to adjust lenses (e.g., lenses 1410) to help address the vergence-accommodation conflict. The vergence-accommodation conflict may result from how humans perceive depth. When a human eye fixates on an object, it accommodates to that object—that is, it changes focal distance to bring that object into focus. That accommodation is a visual cue to depth: objects that are much closer or further away than that distance are out of focus on the retina. This "retinal blur" is a cue that objects are at a different distance than the accommodative distance, although the cue is ambiguous as to whether the objects are closer or more distant.

When both eyes are used (stereoscopically), binocular disparity is the main visual cue for depth. The two eyes look at an object from slightly different angles, so they get slightly different views of the object. This difference in views is the binocular disparity (imperfect match) between the two views. The visual system normally fuses these two images into a single perception and converts the disparity between the two images into a perception of depth. The closer an object is, the larger the disparity (error in matching) between the images it produces on the two retinas.

In a typical virtual reality head-mounted device, a virtual display plane, or focal plane, may be located at a fixed distance. But virtual objects may be "located" either in front of or behind the focal plane. The head-mounted display may try to reproduce binocular disparity for such virtual objects, which is the main visual cue for depth. But the binocular disparity cue may drive the eyes to verge at one distance, while the light rays coming from the virtual plane may produce retinal blur that drives the eyes to accommodate to another distance, creating a conflict between those depth cues and forcing the viewer's brain to unnaturally adapt to conflicting cues. This vergence-accommodation conflict in turn creates visual fatigue, especially during prolonged use of an augmented reality system.

Figure 15:
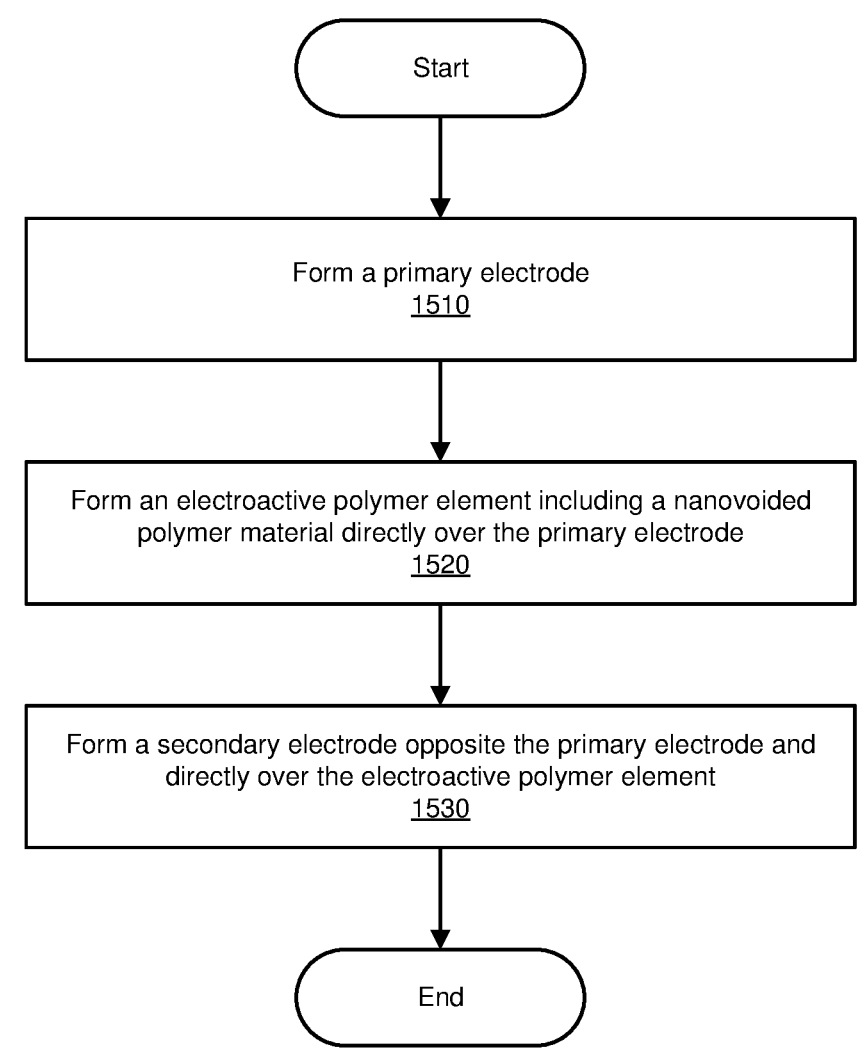
FIG. 15 is a flow diagram of an example method for fabricating electroactive devices according to some embodiments.

FIG. 15 shows a flow diagram of an example method 1500 for producing an electroactive device, in accordance with example embodiments of the disclosure. At step 1510, a primary electrode (e.g., primary electrode 130a in FIGS. 1-3) may be formed.

At step 1520 in FIG. 15, an electroactive polymer element (e.g., first electroactive polymer element 105 in FIGS. 1-3) including a nanovoided polymer material may be formed directly over the primary electrode.

At step 1530 in FIG. 15, a secondary electrode (e.g., electroactive polymer element in FIGS. 1-3) may be formed opposite the primary electrode and directly over the electroactive polymer element. The electroactive polymer element may exhibit at least one of a negative effective Poisson's ratio along at least one dimension or non-linear resistance to deformation with respect to an amount of deformation of the electroactive polymer element.

According to various embodiments, the electroactive polymer element of an electroactive device may be disposed between electrodes and may include a nanovoided polymer material. The nanovoids may be distributed regularly or randomly throughout the polymer matrix and enable engineering of various characteristics of the electroactive polymer element, such as the stress-strain behavior of the electroactive polymer element in the presence of a voltage gradient between the electrodes.

In some examples, the nanovoids may provide a negative Poisson's ratio and an attendant lateral contraction during induced compression of the electroactive polymer element. The effective Poisson's ratio (i.e., the Poisson's ratio of the nanovoided material) may be negative in one or two lateral dimensions, such as mutually-orthogonal dimensions. In additional examples, the nanovoids may provide an enhanced force density, enabling the electroactive devices to operate in a manner comparable to natural muscle during contraction.

In some embodiments, an electroactive polymer element may include multiple layers (e.g., hundreds or thousands of sub-micron layers) of nanovoided polymer material disposed between multiple corresponding electrode pairs.

Electroactive devices described and shown herein may be utilized in any suitable technologies, without limitation. For example, such electroactive devices may be utilized as mechanical actuators to actuate movement of adjacent components. In at least one embodiment, the disclosed electroactive devices may be incorporated into optical systems such as adjustable lenses (e.g., fluid-filled lenses) as described herein to actuate movement of one or more optical layers. Such actuation may, for example, allow for selected movement of lens layers of an adjustable lens, resulting in deformation of the lens layers to adjust optical characteristics (e.g., focal point, spherical correction, cylindrical correction, axial correction, etc.) of the adjustable lens. In some embodiments, electroactive devices as disclosed herein may be utilized as actuators in micromechanical apparatuses, such as microelectromechanical devices. Additionally or alternatively, electroactive devices may be used for converting mechanical energy to electrical energy for use in energy harvesting systems and/or sensor apparatuses.

Embodiments of the instant disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The display devices and systems described and/or illustrated herein broadly represent any type or form of computing device or system capable of executing computer-readable instructions, such as those contained within the modules described herein. In their most basic configuration, these device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A device comprising:
   a primary electrode;
   a secondary electrode overlapping at least a portion of the primary electrode; and
   an electroactive polymer element comprising a nanovoided polymer material disposed between and abutting the primary electrode and the secondary electrode,
   wherein resistance to deformation of the electroactive polymer element is non-linear with respect to an amount of deformation of the electroactive polymer element.

2. The device of claim 1, wherein nanovoids occupy at least approximately 10% by volume of the nanovoided polymer material.

3. The device of claim 1, wherein a distribution of nanovoids within the electroactive polymer element is substantially homogenous.

4. The device of claim 1, wherein the electroactive polymer element has a thickness of 100 nanometers to 10 micrometers.

5. The device of claim 1, wherein a distribution of nanovoids within the electroactive polymer element varies with thickness of the electroactive polymer element.

6. The device of claim 1, wherein a distribution of nanovoids within the electroactive polymer element varies laterally between the primary electrode and the secondary electrode.

7. The device of claim 1, wherein the electroactive polymer element has a strain energy greater than an electrostatic energy when an electric field of approximately 10% to approximately 90% of a dielectric strength of the electroactive polymer element is applied between the primary electrode and the secondary electrode.

8. The device of claim 1, wherein a stress-strain curve of the electroactive polymer element has a slope that increases with increasing strain.

9. The device of claim 1, wherein a stress-strain curve of the electroactive polymer element includes a negative slope.

10. The device of claim 1, wherein the electroactive polymer element comprises particles of a material having a high dielectric constant, the particles having an average diameter between approximately 10 nm and approximately 1000 nm.

11. The device of claim 10, wherein the material having the high dielectric constant comprises barium titanate.

12. An electroactive device comprising:
    a primary electrode;
    a secondary electrode overlapping at least a portion of the primary electrode; and
    an electroactive polymer element comprising a nanovoided polymer material disposed between and abutting the primary electrode and the secondary electrode,
    wherein the electroactive polymer element exhibits a negative effective Poisson's ratio along at least one dimension.

13. The electroactive device of claim 12, wherein nanovoids occupy at least approximately 10% by volume of the nanovoided polymer material.

14. The electroactive device of claim 12, wherein a distribution of nanovoids within the electroactive polymer element is substantially homogenous.

15. The electroactive device of claim 12, wherein the electroactive polymer element has a thickness of 100 nanometers to 10 micrometers.

16. The electroactive device of claim 12, wherein:
    the electroactive polymer element is configured to contract in a direction parallel to an electric field generated between the primary electrode and the secondary electrode, and
    the electroactive polymer element is configured to contract in at least one direction orthogonal to the electric field.

17. A method comprising:
    forming a primary electrode;
    forming an electroactive polymer element comprising a nanovoided polymer material directly over the primary electrode; and
    forming a secondary electrode opposite the primary electrode and directly over the electroactive polymer element, wherein the electroactive polymer element exhibits at least one of:
    a negative effective Poisson's ratio along at least one dimension, or
    non-linear resistance to deformation with respect to an amount of deformation of the electroactive polymer element.

18. The method of claim 17, wherein the electroactive polymer element exhibits a negative effective Poisson's ratio along each of a pair of mutually orthogonal dimensions.

19. The method of claim 17, wherein the electroactive polymer element has a strain energy greater than an electrostatic energy when an electric field of approximately 10% to approximately 90% of a dielectric strength of the electroactive polymer element is applied between the primary electrode and the secondary electrode.

20. The method of claim 17, wherein a stress-strain curve of the electroactive polymer element includes a negative slope.

* * * * *